United States Patent
Linnen et al.

(10) Patent No.: US 12,051,482 B2
(45) Date of Patent: Jul. 30, 2024

(54) DATA STORAGE DEVICE WITH NOISE INJECTION

(71) Applicant: Western Digital Technologies, Inc., San Jose, CA (US)

(72) Inventors: Daniel Joseph Linnen, Naperville, IL (US); Kirubakaran Periyannan, Saratoga, CA (US); Ramanathan Muthiah, Bangalore (IN); Grant Chapman Mackey, Laguna Hills, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 79 days.

(21) Appl. No.: 17/847,080

(22) Filed: Jun. 22, 2022

(65) Prior Publication Data

US 2023/0420006 A1   Dec. 28, 2023

(51) Int. Cl.
   *G11C 7/10*       (2006.01)
   *G06N 3/063*      (2023.01)
   *G11C 7/12*       (2006.01)

(52) U.S. Cl.
   CPC ........... *G11C 7/1039* (2013.01); *G06N 3/063* (2013.01); *G11C 7/1009* (2013.01); *G11C 7/1096* (2013.01); *G11C 7/12* (2013.01)

(58) Field of Classification Search
   CPC ... G11C 7/1039; G11C 7/1009; G11C 7/1096; G11C 7/12; G06N 3/063
   See application file for complete search history.

(56) References Cited

U.S. PATENT DOCUMENTS

| 5,050,095 A | 9/1991 | Samad |
| 7,313,550 B2 | 12/2007 | Kulkarni et al. |

(Continued)

FOREIGN PATENT DOCUMENTS

CN    113516172 A    10/2021

OTHER PUBLICATIONS

Kim, Minsu, "Non-Volatile Neuromorphic Computing based on Logic-Compatible Embedded Flash Memory Technology", University of Minnesota's Digital Conservancy; Jul. 2020; https://conservancy.umn.edu/handle/11299/216877; 3 pages.

(Continued)

*Primary Examiner* — Ajay Ojha
(74) *Attorney, Agent, or Firm* — LOZA & LOZA, LLP; Gabriel Fitch

(57) ABSTRACT

Noise injection procedures implemented on the die of a non-volatile memory (NVM) array are disclosed. In one example, noise is injected into data by adjusting read voltages to induce bit flips while using feedback to achieve a target amount of information degradation. In another example, random data is iteratively combined with itself to achieve a target percentage of random 1s or 0s, then the random data is combined with data read from the NVM array. In other examples, pixels are randomly zeroed out to emulate dead charge coupled device (CCD) pixels. In still other examples, the timing, voltage, and/or current values used within circuits while transferring data to/from latches or bitlines are adjusted outside their specified margins to induce bit flips to inject noise into the data. The noise-injected data may be used, for example, for dataset augmentation or for the testing of deep neural networks (DNNs).

32 Claims, 29 Drawing Sheets

(56) References Cited

U.S. PATENT DOCUMENTS

| | | | |
|---|---|---|---|
| 8,345,295 | B2 | 1/2013 | Kim |
| 9,239,691 | B2 | 1/2016 | Lam |
| 9,336,483 | B1* | 5/2016 | Abeysooriya ............ G06N 3/08 |
| 9,875,440 | B1 | 1/2018 | Commons |
| 10,180,820 | B2 | 1/2019 | Buchanan et al. |
| 10,356,320 | B2 | 7/2019 | Shirota et al. |
| 10,552,936 | B2 | 2/2020 | Li |
| 11,064,194 | B2 | 7/2021 | Muthiah |
| 2011/0222735 | A1 | 9/2011 | Imai et al. |
| 2019/0311267 | A1* | 10/2019 | Qin ........................ G06N 3/044 |
| 2020/0097807 | A1 | 3/2020 | Knag et al. |
| 2020/0117539 | A1 | 4/2020 | Sun et al. |
| 2020/0134443 | A1 | 4/2020 | Qin |
| 2020/0184335 | A1 | 6/2020 | Rom et al. |
| 2021/0096751 | A1 | 4/2021 | Berman et al. |
| 2021/0110244 | A1* | 4/2021 | Hoang .................... G06F 17/16 |
| 2021/0304009 | A1 | 9/2021 | Bazarsky et al. |
| 2021/0312959 | A1 | 10/2021 | Shan et al. |
| 2021/0382638 | A1* | 12/2021 | Anderson ............. G06F 3/0632 |
| 2022/0067491 | A1* | 3/2022 | Vengertsev ............ G11C 16/10 |

OTHER PUBLICATIONS

Lee, Sung-Tae et al., "Neuromorphic Computing Using NAND Flash Memory Architecture With Pulse Width Modulation Scheme", Frontiers in Neuroscience: Neuromorphic Engineering; Sep. 18, 2020; https://www.frontiersin.org/articles/10.3389/fnins.2020.571292; 9 pages.

Shim, Wonbo et al., "Architectural Design of 3D Nand Flash based Compute-in-Memory for Inference Engine", MEMSYS 2020: The International Symposium on Memory Systems; Sep. 2020; https://dl.acm.org/ doi/10.1145/3422575.3422779; 3 pages.

Wang, Yin et al., "An in-memory computing architecture based on two-dimensional semiconductors for multiply-accumulate operations", Nature Communications; Jun. 7, 2021; https://www.nature.com/articles/s41467-021-23719-3; 28 pages.

Amirsoleimani, Amirali et al., "In-Memory Vector-Matrix Multiplication in Monolithic Complementary Metal-Oxide-Semiconductor-Memristor Integrated Circuits: Design Choices, Challenges, and Perspectives", Advanced Intelligent Systems; vol. 2, Issue 11; Aug. 23, 2020; https://onlinelibrary.wiley.com/doi/full/10.1002/aisy.202000115; 48 pages.

Haj-Ali, Ameer et al., "IMAGING: In-Memory AlGorithms for Image processiNG", IEEE Transactions on Circuits and Systems I: Regular Papers; vol. 65, Issue 12; Dec. 2018; https://ieeexplore.ieee.org/document/8398398; 14 pages.

Zhang, Jintao et al., "In-Memory Computation of a Machine-Learning Classifier in a Standard 6T Sram Array", EEE Journal of Solid-State Circuits; vol. 52, Issue 4; Apr. 2017; https://ieeexplore.ieee.org/abstract/document/7875410; 10 pages.

"An On-device Deep Neural Network for Face Detection", Apple Machine Learning Research; Nov. 2017; https://machinelearning.apple.com/research/face-detection; 10 pages.

Kim, Sung et al., "MATIC: Learning Around Errors for Efficient Low-Voltage Neural Network Accelerators", 2018 Design, Automation & Test in Europe Conference & Exhibition; Mar. 19-23, 2018; https://ieeexplore.ieee.org/document/8341970; 6 pages.

Tsai, Li-Huang et al., "Robust Processing-In-Memory Neural Networks via Noise-Aware Normalization", Nov. 24, 2020; https://arxiv.org/pdf/2007.03230.pdf; 7 pages.

He, Ruiquan et al., "Artificial Neural Network Assisted Error Correction for MLC NAND Flash Memory", Aug. 2021; https://www.ncbi.nlm.nih.gov/pmc/articles/PMC8398337; 19 pages.

Sraw, Jashanpreet Singh et al., "Using Convolutional Neural Networks for fault analysis and alleviation in accelerator systems", Dec. 5, 2021; https://arxiv.org/abs/2112.02657; 8 pages.

Ozen, Elbruz et al., "Low-Cost Error Detection in Deep Neural Network Accelerators with Linear Algorithmic Checksums", Journal of Electronic Testing; Jan. 6, 2021; https://link.springer.com/article/10.1007/s10836-020-05920-2; 16 pages.

Wang, Chen et al., "Neural network based silent error detector", 2018 IEEE International Conference on Cluster Computing; Sep. 10-13, 2018; https://ieeexplore.ieee.org/document/8514878; 10 pages.

Xiao, Patrick T et al., "Analog architectures for neural network acceleration based on non-volatile memory", Applied Physics Reviews 7; Jul. 9, 2020; 35 pages <https://aip.scitation.org/doi/10.1063/1.5143815>.

Hasan, Mehedi et al., "Reliability of NAND Flash Memory as a Weight Storage Device of Artificial Neural Network", IEEE Transactions on Device and Materials Reliability; vol. 20, Issue 3; Sep. 2020; 8 pages <https://ieeexplore.ieee.org/document/9149916>.

Resch, Salonik et al., "PIMBALL: Binary Neural Networks in Spintronic Memory", ACM Transactions on Architecture and Code Optimization; vol. 16, No. 4, Article 41; Oct. 2019; 26 pages <https://arxiv.org/pdf/1812.03989.pdf>.

Mizushina, Keita et al., "Layer-by-layer Adaptively Optimized ECC of NAND flash-based SSD Storing Convolutional Neural Network Weight for Scene Recognition", 2018 IEEE International Symposium on Circuits and Systems (ISCAS), May 27-30, 2018; 5 pages <https://ieeexplore.ieee.org/abstract/document/8351440>.

\* cited by examiner

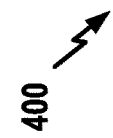

*Exemplary Noise Injection Procedures that additionally receive Information on other Sources of Noise*

402 — Determine the amount of information degradation achieved by adjusting a read voltage level from an optimal voltage to a non-optimal voltage level 404 — Receive an indication from data storage controller of the count of errors corrected by ECC/LDPC for data read at the optimal read voltage level 406 — Receive an indication from data storage controller of a count DAC operations during ECC/LDPC for data read at the optimal read voltage level 408 — Determine an amount of change in a voltage threshold (VT) between an initial write verification read voltage level and a current read voltage level 410 — Determine or estimate a total amount of error from the amount of information degradation achieved by adjusting a read voltage level and the additional error/change information for use as feedback to control further adjustments to the read levels to achieve a target amount of information degradation

FIG. 4

DATA STORAGE DEVICE WITH NOISE INJECTION

FIELD

The disclosure relates, in some embodiments, to non-volatile memory (NVM) arrays. More specifically, but not exclusively, the disclosure relates to methods and apparatus for injecting noise into data sets such as neural network data sets.

INTRODUCTION

Deep learning (which also may be referred to as deep structured learning or hierarchical learning) relates to machine learning methods based on learning data representations or architectures, such as deep neural networks (DNNs), rather than to task-specific procedures or algorithms. Deep learning is applied to such fields as speech recognition, computer vision, and self-driving vehicles. Deep learning may be accomplished by, or facilitated by, deep learning accelerators (DLAs), e.g., microprocessor devices designed to accelerate the generation of useful neural networks to implement deep learning. During the training and testing of DNNs or other neural networks, it may be advantageous to degrade the inputs to the DNNs to evaluate the capability of the DNN to continue to properly determine characteristics of the input (e.g., to correctly identify an object or person in an input image).

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a device formed on a die that includes: a non-volatile memory (NVM) array formed on the die; a first latch and a second latch, each formed on the die; and processing circuitry formed on the die configured to: read data from the NVM array into the first latch; obtain stochastic data; load the stochastic data into a second latch; combine the read data in the first latch with the stochastic data in the second latch to obtain noisy data; and perform at least one data processing operation using the noisy data.

Another embodiment of the disclosure provides a method for use with a device formed on a die that includes an NVM array and a first latch and a second latch. The method includes: reading data from the NVM array into the first latch; obtaining stochastic data; loading the stochastic data into a second latch; combining the read data in the first latch with the stochastic data in the second latch to obtain noisy data; and performing at least one data processing operation using the noisy data.

Yet another embodiment of the disclosure provides a device formed on a die that includes: an NVM array formed on the die; a first latch and a second latch, each formed on the die; and processing circuitry formed on the die configured to: read a bitmap from the NVM array into the first latch, the bitmap comprising a plurality of pixels each having a same bit length; load a bitmap mask into the second latch having bit strings that each have the same bit length as the pixels in the first latch, wherein a plurality of the bit strings comprise masking bit strings that are aligned with randomly selected pixels in the bitmap; combine the bitmap in the first latch with the bitmap mask in the second latch to generate a modified bitmap, wherein pixels in the modified bitmap that correspond to the randomly selected pixels have all their bits set to a particular binary value, and wherein all other pixels in the modified bitmap remain unchanged from the bitmap; and perform at least one image processing operation using the modified bitmap.

Another embodiment of the disclosure provides a method for use with a device that includes an NVM array formed on a die and a first latch and a second latch. The method includes: reading a bitmap from the NVM array into the first latch, the bitmap comprising a plurality of pixels each having a same bit length; loading a bitmap mask into the second latch having bit strings that each have the same bit length as the pixels in the first latch, wherein a plurality of the bit strings comprise masking bit strings that are aligned with randomly selected pixels in the bitmap; combining the bitmap in the first latch with the bitmap mask in the second latch to generate a modified bitmap, wherein pixels in the modified bitmap that correspond to the randomly selected pixels have all their bits set to a particular binary value, and wherein all other pixels in the modified bitmap remain unchanged from the bitmap; and performing at least one image processing operation using the modified bitmap.

Yet another embodiment of the disclosure provides a device formed on a die that includes: an NVM array formed on the die; a latch formed on the die; and processing circuitry formed on the die configured to: load data into the latch; determine a minimum margin parameter to perform a selected latch operation on the data in the latch without margin-based errors; initiate the selected latch operation using the data in the latch; terminate the selected latch operation before the minimum margin parameter has been achieve to inject errors into the data to generate noisy data; and use the noisy data in a machine learning procedure.

Another embodiment of the disclosure provides a method for use with a device that includes an NVM array formed on a die a latch formed on the die. The method includes: loading data into the latch; determining a minimum margin parameter to perform a selected latch operation on the data in the latch without margin-based errors; initiating the selected latch operation using the data in the latch; terminating the selected latch operation before the minimum margin parameter has been achieve to inject errors into the data to generate noisy data; and using the noisy data in a machine learning procedure.

Still another embodiment of the disclosure provides an apparatus for use by a device formed on a die that includes an NVM array and a first latch and a second latch. The apparatus includes: means for reading data from the NVM array into the first latch; means for obtaining stochastic data; means for loading the stochastic data into a second latch; means for combining the read data in the first latch with the stochastic data in the second latch to obtain noisy data; and means for performing at least one data processing operation using the noisy data.

BRIEF DESCRIPTION OF THE DRAWINGS

FIG. 4 illustrates an exemplary read voltage-based procedure, according to aspects of the present disclosure, that also receives information pertaining to other sources of noise to assess a total amount of information degradation.

DETAILED DESCRIPTION

Figure 1:
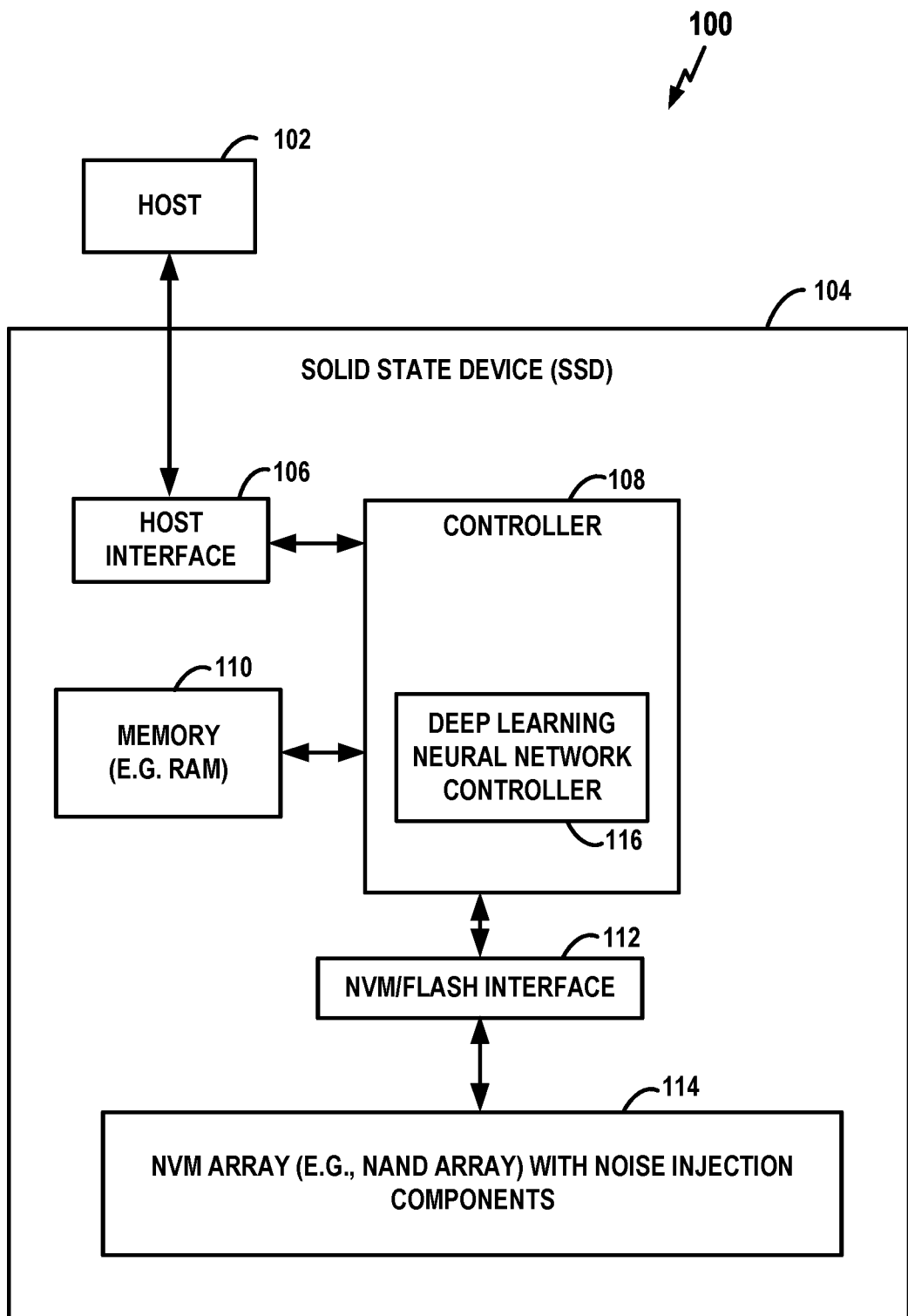
FIG. 1 shows a schematic block diagram configuration for an exemplary solid state device (SSD) having one or more non-volatile memory (NVM) array dies, where the dies have noise injection components, according to aspects of the present disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to non-volatile memory (NVM) arrays, and to data storage devices or apparatus for controlling the NVM arrays, such as a controller of a data storage device (such as an SSD), and in particular to NAND flash memory storage devices (herein "NANDs"). (A NAND is a type of non-volatile storage technology that does not require power to retain data. It exploits negative-AND, i.e., NAND, logic.) For the sake of brevity, an SSD having one or more NAND dies will be used below in the description of various embodiments. It is understood that at least some aspects described herein may be applicable to other forms of data storage devices as well. For example, at least some aspects described herein may be applicable to phase-change memory (PCM) arrays, magneto-resistive random access memory (MRAM) arrays and resistive random access memory (ReRAM) arrays, at least if such devices are equipped with suitable latches for implementing operations discussed herein. In addition to data storage devices, the NVM arrays and associated circuitry and latches in various described embodiments may be implemented as part of memory devices such as dual in-line memory modules (DIMMs) or other types of memory components/modules in some embodiments. Such memory devices may be accessible to a processing component such as a Central Processing Unit (CPU) or a Graphical Processing Unit (GPU). The links between processing components to such memory devices may be provided via one or more memory or system buses, including via interconnects such as Compute Express Link (CXL), Gen-Z, OpenCAPI, NVLink/NVSwitch, Infinity Fabric, Omni-Path and other similar interconnect protocols. In other embodiments, the links between processing components to memory devices may be provided via on-die or die-to-die interconnects. In certain embodiments the NVM arrays and associated circuitry and latches may be co-located on the same die as such processing components such as CPU or GPU.

Overview

As noted above, deep learning may be accomplished by, or facilitated by, deep learning accelerators (DLAs), e.g., microprocessor devices designed to accelerate the generation of deep neural networks (DNNs) to implement deep learning. These networks may also be referred to as learning networks.

Herein, methods and apparatus are disclosed for inserting or injecting noise into DNN data sets for the purposes of testing the efficacy of the trained DNNs on noisy data or for other purposes such as generating augmented DNN data sets for use in training the DNN.

Note that a DNN is an example of an artificial neural network that has multiple layers between input and output layers. A DNN operates to determine a mathematical computation or manipulation to convert the input into the output, which might be a linear or non-linear computation. For example, the DNN may work through its layers by calculating a probability of each output. Each mathematical manipulation may be considered a layer. Networks that have many layers are referred to as having "deep" layers, hence the term DNN. In one particular example, the DNN might be configured to identify a person within an input image by processing the bits of the input image to identify the person, i.e., the output of the DNN is a value that identifies the particular person.

DNNs are often configured as feedforward networks, in which data flows from an input layer to an output layer in one direction. Initially, the DNN may generate a map of virtual "neurons" and assign initial numerical values or "weights" to connections between the neurons. The weights and inputs are multiplied to return output values between, e.g., 0 and 1. The weights may be adjusted in an attempt to improve the accuracy by which the network relates its input to a known output (to, for example, correctly identified an input image).

Herein, in some aspects, the injection of noise into DNN data sets is performed on data stored in an NVM array by adjusting the read voltages of bitlines that store the DNN data to induce errors as the data is read from the bitlines to thereby generate a degraded data set for DNN testing or dataset augmentation. In other aspects, the amount of degradation is assessed and controlled. In still other aspects, noise is injected into DNN data by explicitly using random or pseudorandom data to degrade the data set. In yet other examples, latch-based procedures are employed to inject errors using high-speed latches formed on an NVM die. For example, noise may be injected into data by transferring data from one latch to another without allowing sufficient time for the data to be faithfully or properly transferred based on the timing margins of the transfer circuitry (wherein, by "faithfully" or "properly", it is meant that transferred data matches the original data). Multi-planar embodiments are also presented.

Although some aspects herein are described with reference to latches, it should be understood that other equivalent devices may be used, such as data storage registers. Generally speaking, a latch may be a circuit with states for storing information. In some aspects, the latch is a flip-flop circuit for storing two states. A latch may be referred to as a data storage element and may store a plurality of bits of data where each bit is in one of two states: either 0 or 1. In other aspects, a latch may be a memory unit with two or more states. In some aspects, a latch may be referred to as a cache memory and may be configured as a memory element for temporarily holding data. Latches are typically volatile memory devices (even when implemented as a component on an NVM die). However, a latch might be implemented as a NVM device (although that would typically be too slow for practical use). Further, although described primarily with reference to NVM arrays, at least some aspects of the disclosure may apply to volatile memory chips as well, particularly those equipped with suitable latches.

Exemplary SSD Implementation of Latch-Based Parity Detection and Trimming

FIG. 1 is a block diagram of a system 100 including an exemplary SSD having an NVM with bitline-based and/or latch-based noise injection components in accordance with aspects of the disclosure. The NVM array may also include various on-chip deep learning DLA components. The system 100 includes a host 102 and an SSD 104 coupled to the host 102. The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may a computing device, a personal computer, a portable computer, a workstation, a server, a personal digital assistant, a digital camera, or a digital phone as merely a few examples. Additionally or alternatively, the host 102 may be a system or device having a need for neural network processing, such as speech recognition, computer vision, and self-driving vehicles. For example, the host 102 may be a component of a self-driving system of a vehicle.

The SSD 104 includes a host interface 106, a controller 108, a memory 110 (such as a random access memory (RAM)), an NVM interface 112 (which may be referred to as a flash interface), and an NVM 114, such as one or more NAND dies. The NVM 114 may be configured with noise injection components. The host interface 106 is coupled to the controller 108 and facilitates communication between the host 102 and the controller 108. The controller 108 is coupled to the memory 110 as well as to the NVM 114 via the NVM interface 112. The host interface 106 may be any suitable communication interface, such as an Integrated Drive Electronics (IDE) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link.

The controller 108 controls operation of the SSD 104. In various aspects, the controller 108 receives commands from the host 102 through the host interface 106 and performs the commands to transfer data between the host 102 and the NVM 114. Furthermore, the controller 108 may manage reading from and writing to memory 110 for performing the various functions effected by the controller and to maintain and manage cached information stored in memory 110.

The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The memory 110 may be any suitable memory, computing device, or system capable of storing data. For example, the memory 110 may be ordinary RAM, DRAM, double data rate (DDR) RAM (DRAM), static RAM (SRAM), synchronous dynamic RAM (SDRAM), a flash storage, an erasable programmable read-only-memory (EPROM), an electrically erasable programmable ROM (EEPROM), or the like. In various embodiments, the controller 108 uses the memory 110, or a portion thereof, to store data during the transfer of data between the host 102 and the NVM 114. For example, the memory 110 or a portion of the memory 110 may be a cache memory. The NVM 114 receives data from the controller 108 via the NVM interface 112 and stores the data. The NVM 114 may be any suitable type of non-volatile memory, such as a NAND-type flash memory or the like. In the example of FIG. 1, the controller 108 may include hardware, firmware, software, or any combinations thereof that provide a deep learning neural network controller 116 for use with the NVM array 114.

Although FIG. 1 shows an example SSD and an SSD is generally used as an illustrative example in the description throughout, the various disclosed embodiments are not necessarily limited to an SSD application/implementation. As an example, the disclosed NVM die and associated processing components can be implemented as part of a package that includes other processing circuitry and/or components. For example, a processor may include, or otherwise be coupled with, embedded NVM and associated circuitry and/or components for deep learning that are described herein. The processor could, as one example, off-load certain deep learning tasks to the NVM and associated circuitry and/or components. As another example, the controller 108 may be a controller in another type of device and still include the neural network controller 116 and perform some or all of the functions described herein.

Figure 2:
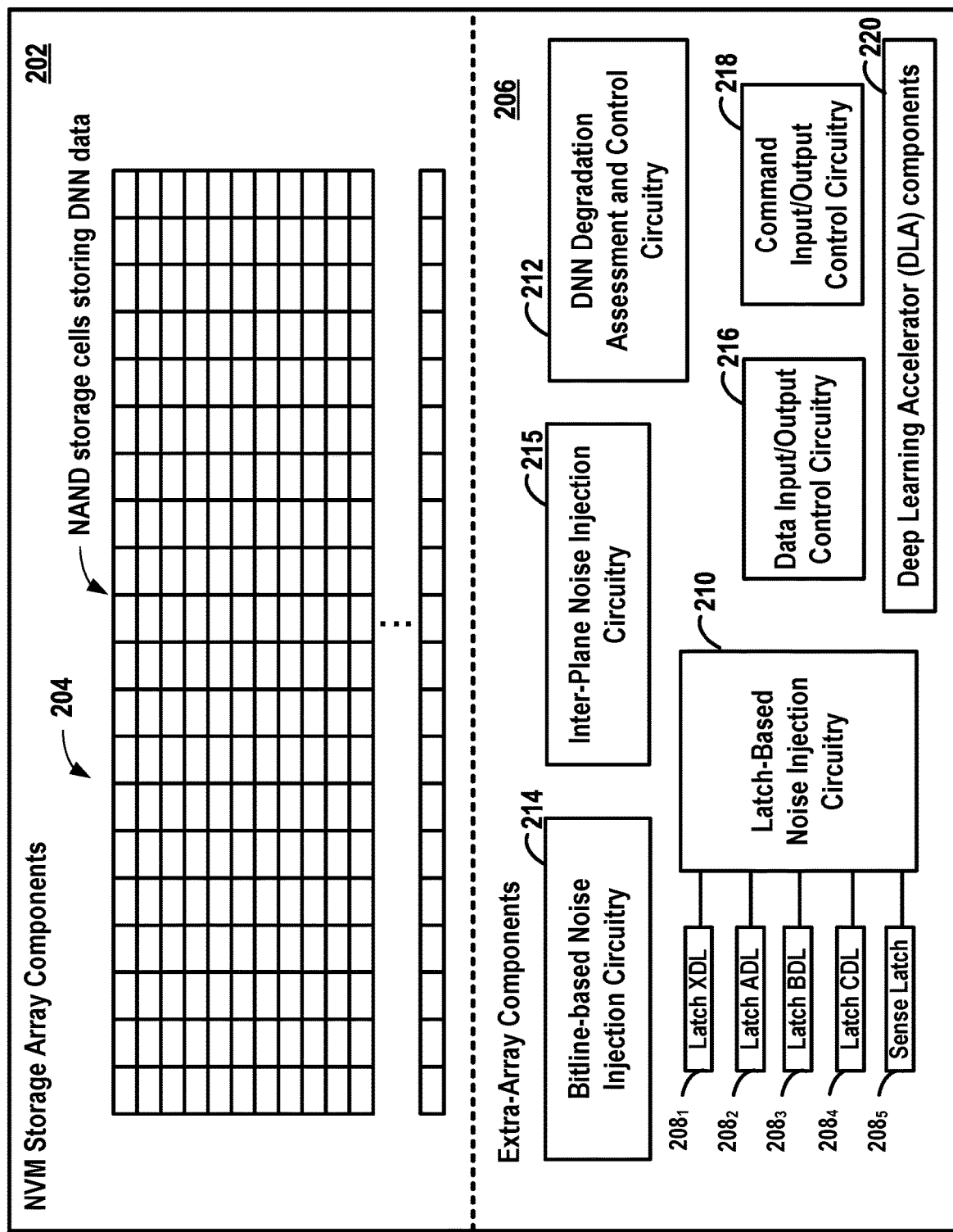
FIG. 2 illustrates an exemplary NVM array die that includes various noise injection components and latches that may be used by the noise injection components, according to aspects of the present disclosure.

FIG. 2 is a block diagram illustrating an exemplary NVM die 200 configured for performing various noise injection and noise assessment operations for use with DNN datasets. For clarity, FIG. 2 omits other components that may be needed for performing other aspects of DNN processing, such as any on-chip DLA components. NVM die 200 includes NVM storage array components 202 include NAND storage cells 204 for storing DNN data or other neural network data or machine learning data, where the cells may be arranged in bitlines (word lines), blocks, planes, or the like. NVM die 200 also includes extra-array processing components 206, which are referred to herein as "extra-array" because they are not part of the NAND array 202. The extra-array components 206 may be configured, for example, as under-the-array or next-to-the array circuit components, and may include otherwise standard NAND die latches (XDL, ADL, BDL, CDL).

In the example of FIG. 2, the exemplary processing components 206 include: a set of latches 208, specifically 208$_1$, 208$_2$, 208$_3$, 208$_4$, and 208$_5$; latch-based noise injection circuits 210 for controlling the latches 208 to perform various noise injection procedures; DNN degradation assessment and control circuitry 212 for assessing and controlling an amount of degradation to be achieved via noise injection; bitline-based noise injection circuitry 214 for controlling various bitline-based noise injection procedures; inter-plane-based noise injection circuitry 215 for controlling various inter-plane noise injection procedures; data input/output control circuitry 216 for inputting data from the data storage controller (e.g., controller 108 of FIG. 1) and outputting data to the data storage controller; and command input/output control circuitry 218 for inputting commands from the data storage controller, e.g., NVM read commands or write (program) commands and for outputting signals indicating completion of the commands (or error indicators if, for some reason, a particular command is not executed). As shown, in some examples, the NVM die 200 may include DLA components 220 for performing on-chip DLA (including, for example, on-chip feedforward and backpropagation operations to train a DNN that includes the DNN data in the NVM array 204). In other examples, DNN data is transferred off-chip to a data storage controller or host to perform such operations.

The operation of the various extra-array components 206, particularly circuits 210, 212, 214, and 215 will be described in greater detail below. Note that not all circuit or memory components that might be used in a practical NVM die are illustrated in the figure, such as voltage regulation components, clocks and timing components, etc. Rather only some components and circuits are shown, summarized as blocks.

Exemplary Read Voltage-Based Noise Injection Assessment and Control Procedures

Figure 3:
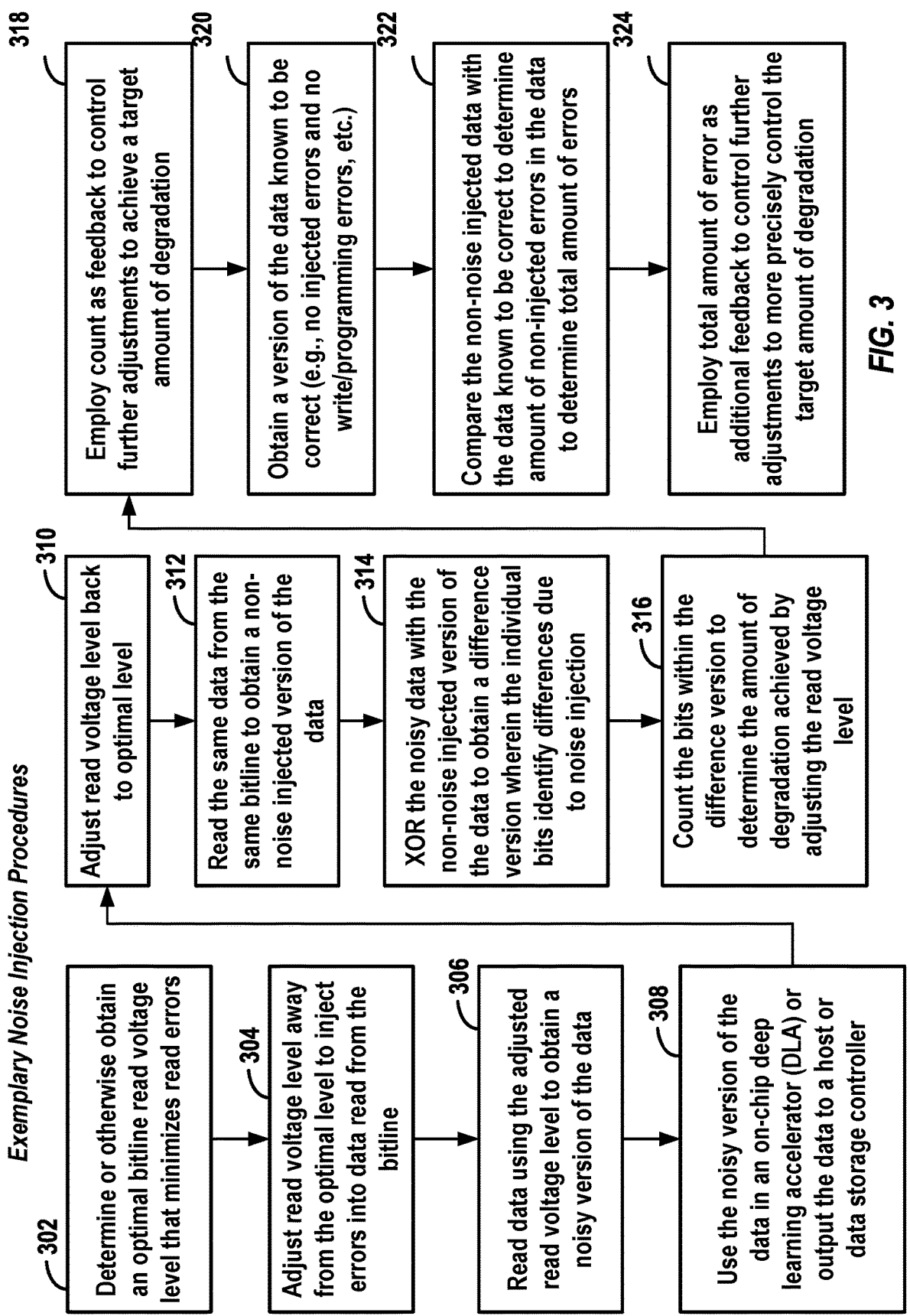
FIG. 3 is a flow chart of an exemplary read voltage-based procedure, according to aspects of the present disclosure, for injecting noise into data by adjusting read voltages to non-optimal levels, assessing an amount of information degradation achieved, and using the assessment as feedback for controlling further read voltage adjustments to achieve a target degree of information degradation.

FIG. 3 summarizes a procedure 300 for injecting noise into DNN data by adjusting read voltages, assessing an amount of information degradation achieved, and using the assessment as feedback for controlling further read voltage adjustments to achieve a target degree of information degradation.

Beginning at block 302, the DNN degradation assessment and control circuitry 212 of FIG. 2 (or another suitable component) begins by determining or otherwise obtaining an optimal (or preferred) bitline read voltage level that minimizes read errors. Procedures for determining or estimating optimal read voltage levels are well known in the art and will not be described herein. At block 304, the circuitry 212 adjusts the read voltage level to a sub-optimal level that differs from optimal level so as to inject errors into data read from the bitline. For example, the circuitry 212 may reduce the read level voltage by 10% in an effort to inject errors into data that is read from the bit line to generate a noisy version of the data for DNN testing or DNN dataset augmentation purposes. At block 306, the circuitry 212, reads data using the adjusted read voltage to obtain a noisy version of the data. At block 308, the circuitry 212 uses the noisy version of the data in an on-chip DLA (assuming one is provided on the NVM die) or outputs the data from the NVM die to a host or data storage controller that has a DLA. Note that the noise injected into the data might not be randomly distributed throughout the data using this method because some bits within a bitline may be more susceptible to read errors than others. For example, an adjustment in read voltage might make it more likely that 0s are misread as is as opposed to 1s being misread as 0s. Nevertheless, there will be a random component to the injected noise.

At block 310, the circuitry 212 adjusts the read voltage back to the optimal level and then, at block 312, the circuitry 212 reads the same data from the same bitline using the optimal read voltage level to obtain a non-noise injected version of the data. Note that the data might not be fully correct data since errors might have occurred when the data was initially stored (programmed) into the bitline or arose later. Such error sources may include charge loss, charge gain (disturb), poor programming, non-optimal temperature compensation with cross temperature deltas, etc. Hence, the data read at block 312 is referred to herein as a non-noise injected version of the data to distinguish the data at block 312 from the data read at block 306 (which has noise injected) and to also distinguish the data read at block 312 from a version of the data that is known to be correct.

At block 314, the circuitry 212 XORs the noisy data with the non-noise injected version of the data to obtain a difference version wherein the individual bits identify differences due to noise injection. For example, the noisy data may be loaded into a first latch and the non-noise injected version of the data may be loaded into a second latch, and then the contents of the two latches can be XORed together, with the result stored in a third latch. At block 316, the circuitry 212 counts the bits within the difference version (e.g., the version in the third latch) to assess the amount of degradation that had been achieved by adjusting the read voltage. For example, if 5% of the bits are different, then a 5% degradation in the data was achieved by adjusting the read level. At block 318, the circuitry 212 employs (e.g., uses) the count (or a percentage value derived from the count) as feedback to control further adjustments to achieve a target amount of degradation. In one example, if the target amount of degradation is 10%, and the count indicates 5% degradation, then the read voltage can be adjusted (at block 304) to move the read voltage further from the optimal read voltage level. In one example, if the target amount of degradation is 10%, and the count indicates 15% degradation, then the read voltage can be adjusted (at block 304) to be somewhat closer to the optimal read voltage level. Hence, in some aspects, processing may return from block 318 to block 304 to perform blocks 304-318 in a loop until a desired or target amount of information degradation is achieved. Note that the target amount may be initially programmed into the NVM die by a host or data storage controller based on the needs of an overall DNN system. For example, to test the robustness of a DNN system in a data storage controller to noisy data, a data storage controller may control the circuitry on the NVM die to generate noisy data having a target amount of noise.

As noted above, the data stored in the bitline might have errors due to its initial programming, which would be in addition to any errors intentionally injected into the data during a read. To assess the total amount of error (e.g., to assess the true signal-to-noise value), the procedure of blocks 320-324 may be performed. At block 320, the circuitry 212 obtains a version of the data that is known to be correct (e.g., the data has no injected errors and no write/programming errors, etc.) For example, a data storage controller may send a correct version of the data that the NVM die then loads into a latch so there is no risk of NVM bitline write errors affecting the data. At block 322, the circuitry 212 compares (e.g., XORs) the non-noise injected data (read at block 312) with the data known to be correct (obtained at block 320) to determine or assess the amount of non-injected errors in the data to thereby determine a total amount of error by, for example, then adding the error count obtained at block 316 with an error count obtained at block 322. At block 324, the circuitry 322 employs (e.g., uses) the total amount of error as additional feedback to control further adjustments at block 304 to more precisely control the target amount of degradation.

FIG. 3 thus summarizes some aspects of a procedure for injected noise into DNN data or other data, assessing the information degradation within the data, and employing the assessment as feedback to achieve a target degree of degradation. Note that, in some aspects, blocks 312-324 may be performed only on an occasional or periodic sampling basis to confirm that the proper amount errors are being injected. Also, note that blocks 310 and 312 need not be performed if the non-noise injected data is already available. Note also that the data may be originally encoded with error correction coding (ECC) for storage in the bitline and then decoded as needed in accordance with a low-density parity-check code (LDPC) decoding scheme or the like. The true signal-to-noise ratio in the noise injected data can be determined by adding the errors from the read at the suboptimal level to the errors at the optimal level obtained, e.g., from the LDPC decoding scheme or other sources.

In some examples, to assess the true signal-to-noise ratio, the data storage controller reads the optimal read level data (i.e., the non-noise injected data) out of the NVM die and decodes the data using LDPC or the like to correct for the bit errors. During this correction, the count of the bit errors that had to be corrected with ECC thus becomes known to the data storage controller. To communicate this information to the NVM die, the data storage controller may write the information into a register on the NVM die. Since the NVM die is targeting to corrupt data to a certain level by read threshold adjustment, this information can be used by circuitry 212 to make further adjustments to the read voltage level to achieve a target amount of noise.

Still further, note that many modern NAND-based NVM devices are capable of estimating the number of bit errors that are likely being introduced by various mechanisms by analyzing how different read levels impact the data. In this regard, when writing (programming) data, the NVM die tries to place cells into optimal locations. These locations are largely a function of a write verification level. The typical (standard) read level is an offset from the verify level to create a target read for default conditions. To estimate the impact of a majority of various bit-error-inducing mechanisms on an NVM die, the device may determine or count the number of digital-analog-conversion (DAC) steps occurring during LDPC between the optimal read under current conditions and the target read under default conditions, i.e., best read for the data vs. target read for normal data. The DAC steps can be correlated to empirical data pertaining to the number of bit errors and used by the NVM die (or data storage controller) to estimate the number of errors already in the data before read level adjustment. The empirical data may be collected and stored by the NVM die while in use or may be generated in advance during NVM die device development and testing and stored in the NVM die.

Another technique to convey similar information is to compare the optimal read to the write verification read level, as those values offset from the standard read. Similarly, the distance (voltage differential) between the standard read levels for multilevel cells (MLC) is known to the NVM die and the distance values provide estimates on how far apart the various MLC read states are. With the optimal locations for this data already being known, the distance between optimal states can be compared to assess the likelihood of errors. Note that some of these techniques may work better for different data sets. For example, methods based on MLC read levels are not appropriate for reads that have a single sense, such as single level cell (SLC) reads. Generally speaking, these various techniques work to assess how much the voltage thresholds (VTs) of the bitline cells have moved (e.g., shifted from an optimal level) and to use that information to factor in how much the bit errors have increased. For example, these techniques can determine a shift in an optimal read level versus the intended read level (i.e., the intended placement of the data) and translate that to (e.g., correlated that with) bit errors. Note that this translation may employ a lookup table, since the empirical values may not be linear and might not follow an equation. (If the translation is linear or otherwise follows an equation, the translation can be computed by programming components with the equation.) Also, note that the empirical data for correlation may be collected by device characterizations teams, on a per-product basis, and then used to generate the tables or equations.

FIG. 4 summarizes a procedure 400 for performing some of the aforementioned additional and/or alternative techniques for determining the true signal-to-noise ratio.

Beginning at block 402, the DNN degradation assessment and control circuitry 212 of FIG. 2 (or another suitable component) determines the amount of information degradation achieved by adjusting the read voltage from an optimal voltage to a non-optimal voltage using, for example, the operations of blocks 302-316 of FIG. 3. At block 404, the circuitry 212 receives an indication from data storage controller of the count of errors corrected by ECC/LDPC for data read at the optimal read voltage. As noted, the data storage controller may write the information into a register on the NVM die. Additionally or alternatively, at block 406, the circuitry 212 receives an indication from data storage controller of a count of DAC operations during ECC/LDPC for data read at the optimal read voltage. As noted, the count of DAC steps can be correlated with empirical data pertaining to the number of bit errors and used by the NVM die (or data storage controller) to estimate the number of errors already in the data before read level adjustment. Additionally or alternatively, at block 408, the circuitry 212 determines an amount of change in a voltage threshold (VT) between an initial write verification read voltage level (i.e., the read voltage used during a write verification) and a current read voltage level. At block 410, the circuitry 212 then determines or estimates a total amount of error from the amount of information degradation achieved by adjusting a read voltage level and the additional error/change information for use as feedback to control further adjustments to the read levels to achieve a target amount of information degradation.

Exemplary Noise Injection Procedures Using Random/Pseudorandom XORing

Figure 5:
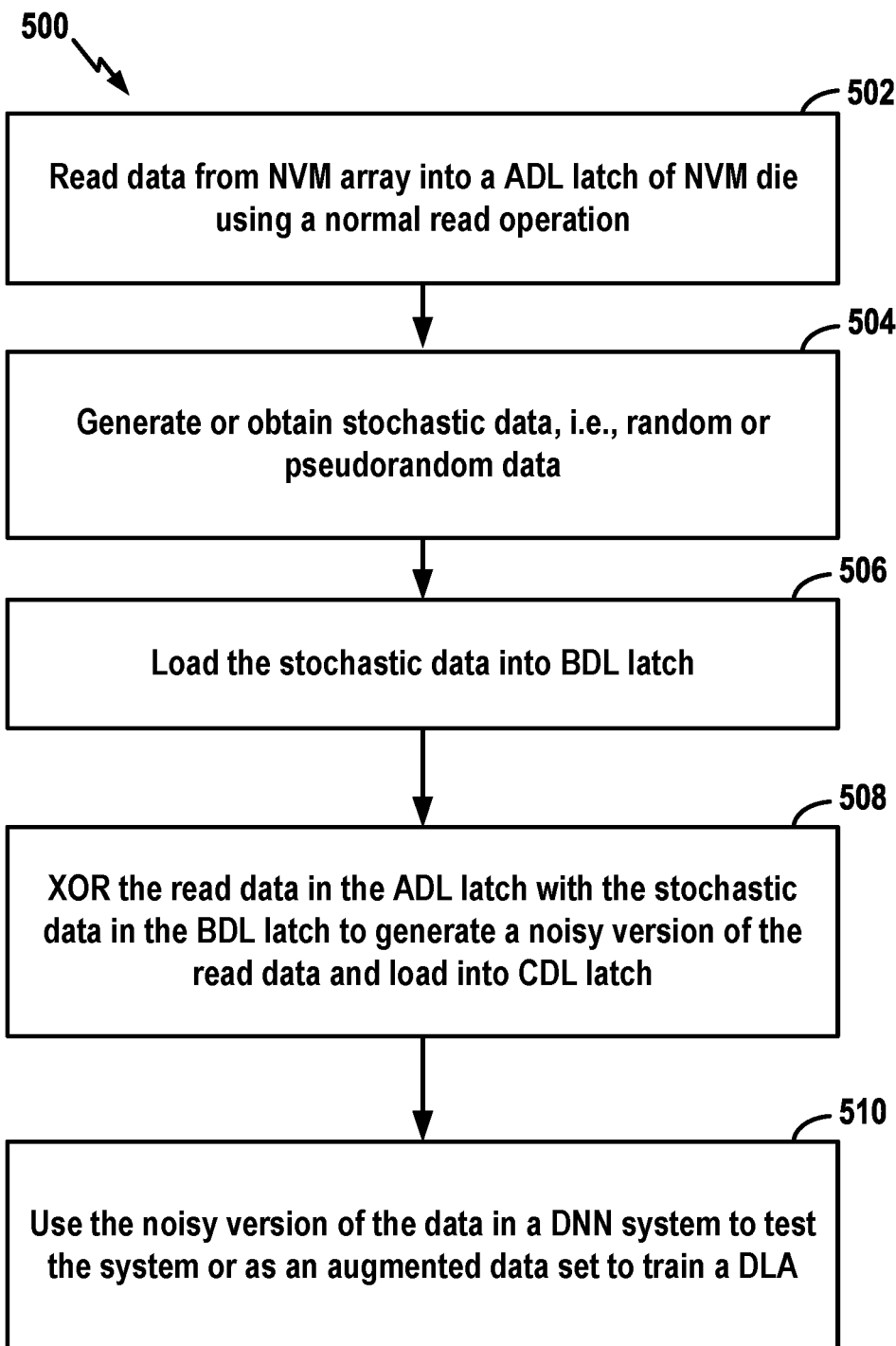
FIG. 5 is a flow chart of an exemplary latch-based procedure, according to aspects of the present disclosure, for injecting noise into data by XORing data read from an NVM array with stochastic data (e.g., random or pseudo-random data).

FIG. 5 summarizes a latch-based procedure 500 for injecting noise into DNN data by XORing DNN or other data read from an NVM array with stochastic data. Herein, by stochastic, it is meant that the data is generated via a random or pseudorandom process to have a random or pseudorandom component or aspect. (As will be explained below, stochastic binary data does not necessarily have an equal number of 1s and 0s.) In this exemplary procedure, and in other exemplary latch-based procedures described herein, particular latches will be used to provide concrete examples (e.g., read data may be first loaded into an ADL latch). These particular latches are just exemplary and other latches may be selected or used.

Beginning at block 502, the latch-based noise injection circuitry 210 of FIG. 2 (or another suitable component) begins by reading data (e.g., DNN data) from an NVM array (e.g., array 204 of FIG. 4) into a first latch (e.g., ADL latch $208_2$ of FIG. 2) using a normal read operation (e.g., a read using an optimal read voltage to obtain non-noise injected data). At block 504, the circuitry 210 generates or obtains stochastic data, e.g., random or pseudorandom data. At block 506, the circuitry 210 loads the stochastic data into a second latch (e.g., BDL latch $208_3$ of FIG. 2). At block 508, the circuitry 210 XORs (or otherwise combines) the read data in the ADL latch with the stochastic data in the BDL latch to generate a noisy version of the read data, which is loaded into a third latch (e.g., the CDL latch $208_4$ of FIG. 2). By XORing the read data with the random data, the resulting output data is significantly degraded with random noise. (Note that for multi-plane NVM dies, the XORing may be performed while transferring data plane to plane. Inter-plane noise injections techniques are discussed below.) At block 510, the NVM die (or data storage controller of host) uses the noisy version of the data in a DNN system to test the system or as an augmented data set to train a DLA. In other examples, the read data might be initially loaded, e.g., into the XDL latch at block 502, with the stochastic data loaded into the CDL latch at block 506, and with the randomized data then XORed into the ADL latch at block 508. These are just some examples.

Note that the loading of the stochastic data into a latch can be achieved easily on a typical NAND-based NVM die since the generation of random or pseudorandom patterns are often used for user data randomization and for use as test mode data patterns. For example, an on-chip randomizer may be provided on the NVM die. If the NVM die has no on-chip randomizer, a randomized dataset may instead be stored in the NVM array in SLC or obtained from encrypted data on the NVME die. Also, note that the operation of block 504 may be performed in parallel with the read of block 502, assuming there were enough free latches. In such a case, a modified read, where the process of transferring the data from the sensing latches to a page cache could be performed while XORing with random data in the page cache so there is no time penalty.

The level of noise injection achieved by the procedure of FIG. 5 is proportional to the number of 1s in the random data set that is XORed with the data at block 508. Assuming an on-chip randomizer is configured to provide 50/50 1s and 0s to prevent so-called "evil" patterns in the NAND-based NVM die (such as a pattern with a single 1 and all other bits 0), this yields a default result of 50% noise injection, which may be excessive in many practical examples. Hence, to minimize this, ANDing random data together reduces the number of 1s, and thus reduces the number of bitflips. This reduces the number of 1s to ~25% for a first round ANDing, 12.5% for a second round, 6.25% for a 3rd round, etc. In one example, this may be performed by copying the data into a set of latches, shifting the copy by some limited but random number of positions (e.g., using a barrel shifter) and then ANDing that data back onto itself, thus reducing the number of 1s in the dataset and thus reducing the amount of noise injection. To increase the level of noise injection, ORing instead of ANDing in the above-described operations increase the number of 1s. For example, ORing and ANDing methods may be used together to "ADD" (combine) one stochastic dataset that has about 6.25% 1s to another stochastic dataset that has about 3.125% 1s to yield a dataset closer to 9% 1s to achieve about 9% error injection. Still further note that random and non-random patterns may be combined to sample bit flips of a random nature. The non-random patterns may have 1s and 0s positioned in particular selected locations so as to provide randomization only within particular portions of a dataset (e.g., to randomize most significant bits versus least significant bits, or vice versa, or to achieve other desired randomizing patterns). Note also that pre-stored test patterns may be used that already have a selected percentage of 1s versus 0s or which already have random bits distributed so as to take into account that some bits might be more likely to flip than others within a bitline or wordline. Note also that in some examples, the data is initially scrambled before it is stored in the NVM array and then, after noise is injected, the data is unscrambled. Scrambling may be performed so that the data has a more even distribution of 1s and 0s prior to the injection of noise. The noisy version of the data is then unscrambled prior to use.

Figure 6:
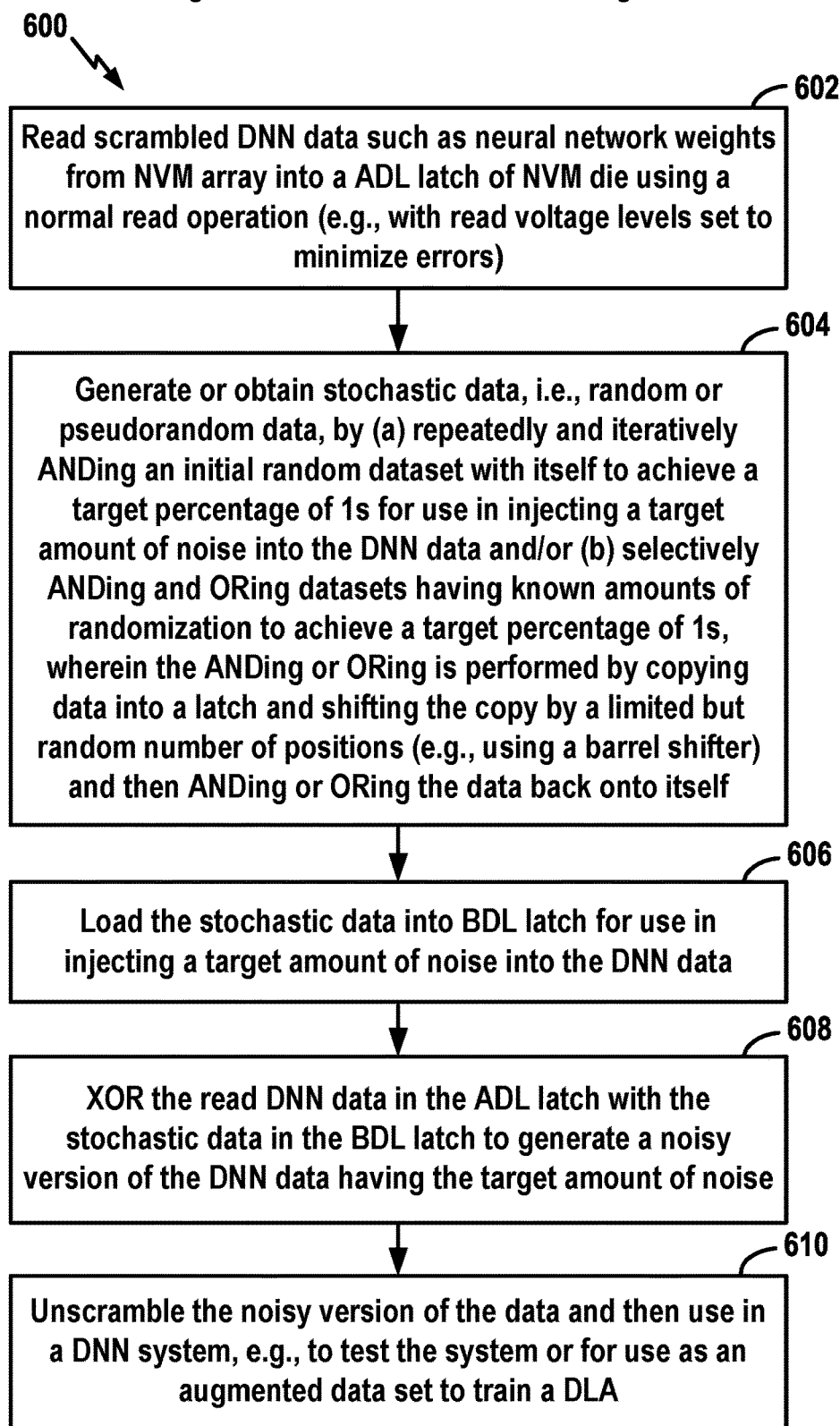
FIG. 6 is a flow chart of additional exemplary latch-based procedure, according to aspects of the present disclosure, for injecting noise into data by XORing data, including scrambling and de-scrambling the data.

At least some of these additional features are illustrated in FIG. 6, particularly for an example processing scrambled DNN data. Beginning at block 602, the circuitry 210 of FIG. 2 reads scrambled DNN data such as scrambled neural network weights from an NVM array into a first latch using a normal read operation (e.g., a read where the read voltages are set to optimal levels to minimize errors). At block 604, the circuitry 210 generates or obtains stochastic data, e.g., random or pseudorandom data, by (a) repeatedly and iteratively ANDing an initial random dataset with itself to achieve a target percentage of 1s for use in injecting a target amount of noise into the DNN data and/or (b) selectively ANDing and ORing datasets having known amounts of randomization to achieve a target percentage of 1s, wherein the ANDing or ORing is performed by copying data into a latch and shifting the copy by a limited but random number of positions (e.g., using a barrel shifter) and then ANDing or ORing the data back onto itself. At block 606, the circuitry 210 loads the stochastic data into a second latch for use in injecting a target amount of noise into the DNN data. At block 608, the circuitry 210 XORs the read DNN data in the ADL latch with the stochastic data in the BDL latch to generate a noisy version of the DNN data having the target amount of noise. At block 610, components on the NVM die (or components within the data storage controller or host) unscrambles the data (to reverse the original scrambling) and the uses the unscrambled noisy version of the data in a DNN system, e.g., to test the system or for use as an augmented data set to train a DLA.

Exemplary Noise Injection Procedures to Simulate Dead CCD

Figure 7:
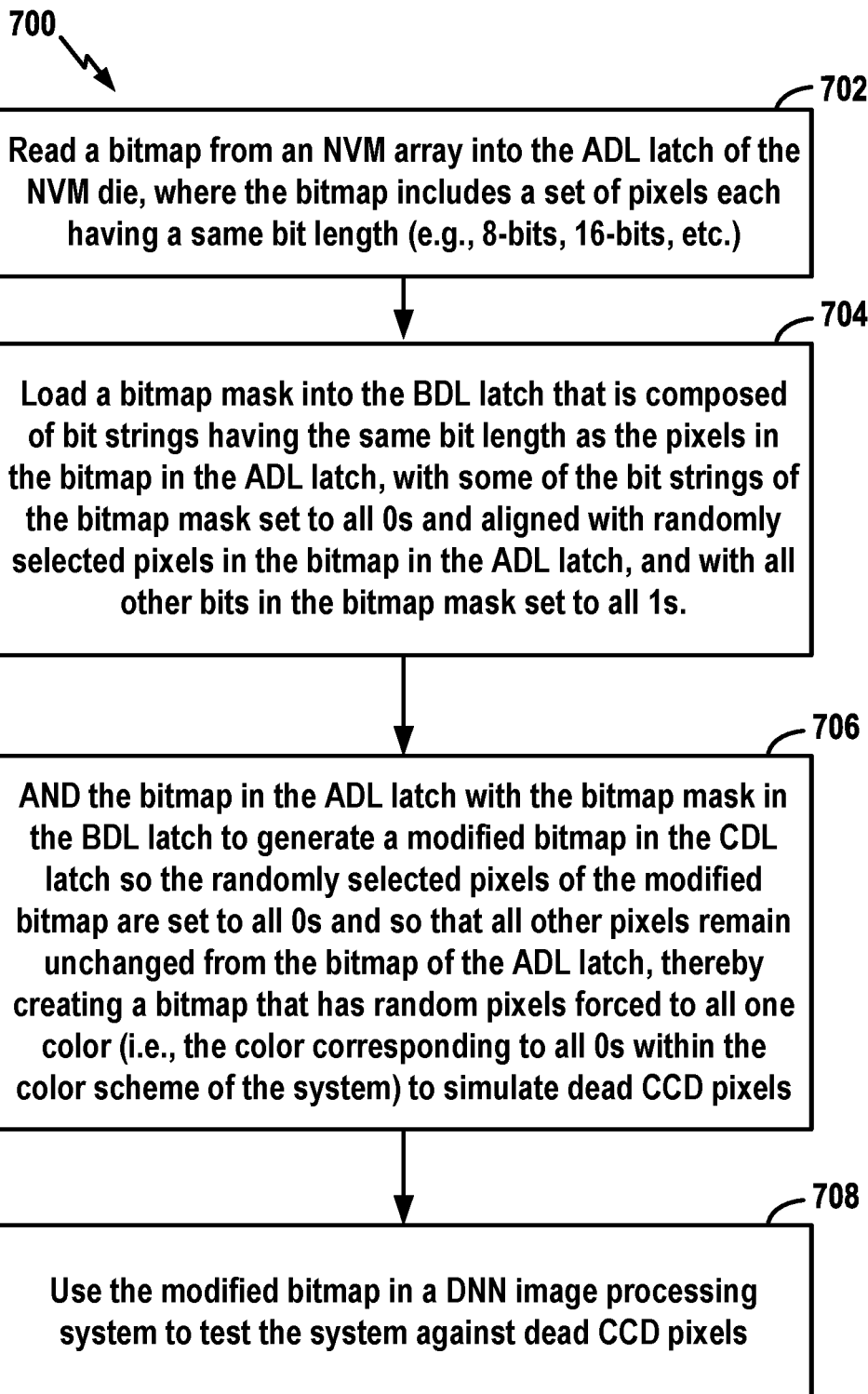
FIG. 7 is a flow chart of additional exemplary latch-based procedure, according to aspects of the present disclosure, for injecting noise into data to simulate dead charge coupled device (CCD) pixels within bitmapped images.

FIG. 7 summarizes a latch-based procedure 700 for injecting noise into image bitmap data to simulate dead charge coupled device (CCD) pixel sensors. In this regard, when processing image bitmaps, it is sometimes desirable to force pixels to one color to simulate a dead CCD device (or to force grayscale pixels to pure white or pure black), which may be done to test a DNN configured to recognize images or perform other image processing functions. This may be achieved by forcing the data corresponding to random pixels to all 0s (or all 1s).

Beginning at block 702, the latch-based noise injection circuitry 210 of FIG. 2 (or another suitable component) reads a bitmap from an NVM array (e.g., array 204 of FIG. 2) into the ADL latch of the NVM die, where the bitmap includes a set of pixels each having a same bit length (e.g., 8-bits, 16-bits, etc.). At block 704, the circuitry 210 loads a bitmap mask into the BDL latch wherein the bitmap mask is composed of bit strings having the same bit length as the pixels in the bitmap in the ADL latch. Some of the bit strings of the bitmap mask are set to all 0s and are aligned with randomly selected pixels in the bitmap that is in the ADL latch. All other bits in the bitmap mask are set to all 1s. At block 706, the circuitry 210 ANDs the bitmap in the ADL latch with the bitmap mask in the BDL latch to generate a modified bitmap in the CDL latch so that the randomly selected pixels of the modified bitmap are set to all 0s and so that all other pixels remain unchanged from the bitmap of the ADL latch, thereby creating a bitmap that has random pixels forced to all one color (i.e., the color corresponding to all 0s within the color scheme of the system) so as to simulate dead CCD pixels (and thereby inject noise into the bitmap). At block 708, components on the NVM die (or components within the data storage controller or host) use the modified bitmap in a DNN image processing system to test the system against dead CCD pixels. For example, the system may determine whether objects or faces within images can still be recognized despite some number of dead CCD pixels.

Figure 8:
FIG. 8 is a diagram illustrating aspects of the latch-based procedure of FIG. 7, according to aspects of the present disclosure.

FIG. 8 illustrates an ADL latch 800 loaded with a bitmap image composed of pixels 802. In this example, each pixel is 8-bits. FIG. 8 also illustrates a BDL latch 806 loaded with a bitmap mask composed of bit strings that have the same bit length of 8-bits and which are aligned with the pixels of the ADL latch. Some of the bit strings 808 of the BDL latch 806 are set to all 0s, as shown. These bitstrings are randomly distributed throughout the BDL latch 806 (while maintaining alignment with the pixels of the ADL latch 800). All other bitstrings 810 in the BDL latch 806 are set to all 1s. FIG. 8 also illustrates a CDL latch 812 holding the resulting modified bitmap composed of some pixels 802 that are unchanged from the ADL latch 800 and other pixels/bit strings 808 that have been forced to all 0s.

Note that, in an alternative implementation, the bitmap mask may be reversed, i.e., the defaults bits are all 0s and the randomly selected forcing pixels are set to all 1s. The ADL latch is then XORed with the BDL latch to force the randomly selected pixels to all 1s. Note also that the procedure of FIGS. 7 and 8 may be applied to grayscale bitmaps where each pixel corresponds to a grayscale shade (or intensity) rather than a color. The procedure may also be applied to monochrome bitmaps where each "pixel" is a single bit.

Thus, by knowing the length of data in a pixel, i.e., a single bit (monochrome), 8-bit, 16-bit, 24-bit, etc., and then generating a mask pattern to mask randomly selected pixels (or monochrome bits) in an input bitmap, the randomly selected pixels (or monochrome bits) are forced to fixed values to simulate a dead CCD or otherwise inject noise into the bitmap.

In one particular example, the procedure begins by generating or obtaining a random bit string having the same length as the bitmap. Based on the known bit length of pixels (e.g., 8-bits) in the bitmap, the random bit string can be regarded as a set of pixels of the same bit length (e.g., 8-bits). The most significant bit (MSB) within each of the pixels is identified (e.g., bit 1 out of bits 1-8) and that MSB bit is copied into the other bits locations of the pixel (e.g., bits 2-8) by repeatedly shifting the bit until all bits within pixel are the same as the MSB. Thus, some of the pixels are then all 1s and other pixels are then all 0s, depending upon the value of the MSB in each pixel. Since the original bitstring was random, the pixels that are all 0s are randomly distributed among the pixels that are all 1s. This results in a 50/50 distribution. If used as a bitstring mask, the result would be to randomly force half of the pixels in an input bitmap image to represent dead CCD pixels. For practical applications, this may be excessive. Hence, the same procedure described above in connection with FIG. 6 can be applied to the initial random bit string to convert it from 50% 0s and 50% 1s to some target percentage of 0s. That is, the operations of block 604 may be applied to the initial random bit string to generate a modified random string having a target percentage of 0s. The modified random string is then processed as just described to identify the MSB in each pixel and then copy and shift that bit to the bit locations. The result is a bitmap mask having a target percentage of pixels that are all 0s to AND with the bitmap image and impart a target amount of noise. For the alternative case where the XORing used, the bitmap mask may be generated to have a target percentage of pixels that are all 1s. Note also that rather than identifying the MSB within each pixel of the input bitstring, the device might instead identify the least significant (LSB).

Note also that the bits within the latches can be inverted as needed to swap 1s for 0s and vice versa to help achieve a target percentage of noise injection depending upon whether ANDing or ORing is used. Still further, in some examples, rather than applying a mask to zero out all bits in a pixel to simulate a completely dead pixel, the mask may instead zero out only one (or a few) of the bits in the pixel so as to inject noise into the pixel by, for example, zeroing out the MSB of the pixel.

Exemplary Noise Injection Procedures Based on Timing Margin Violations

Figure 9:
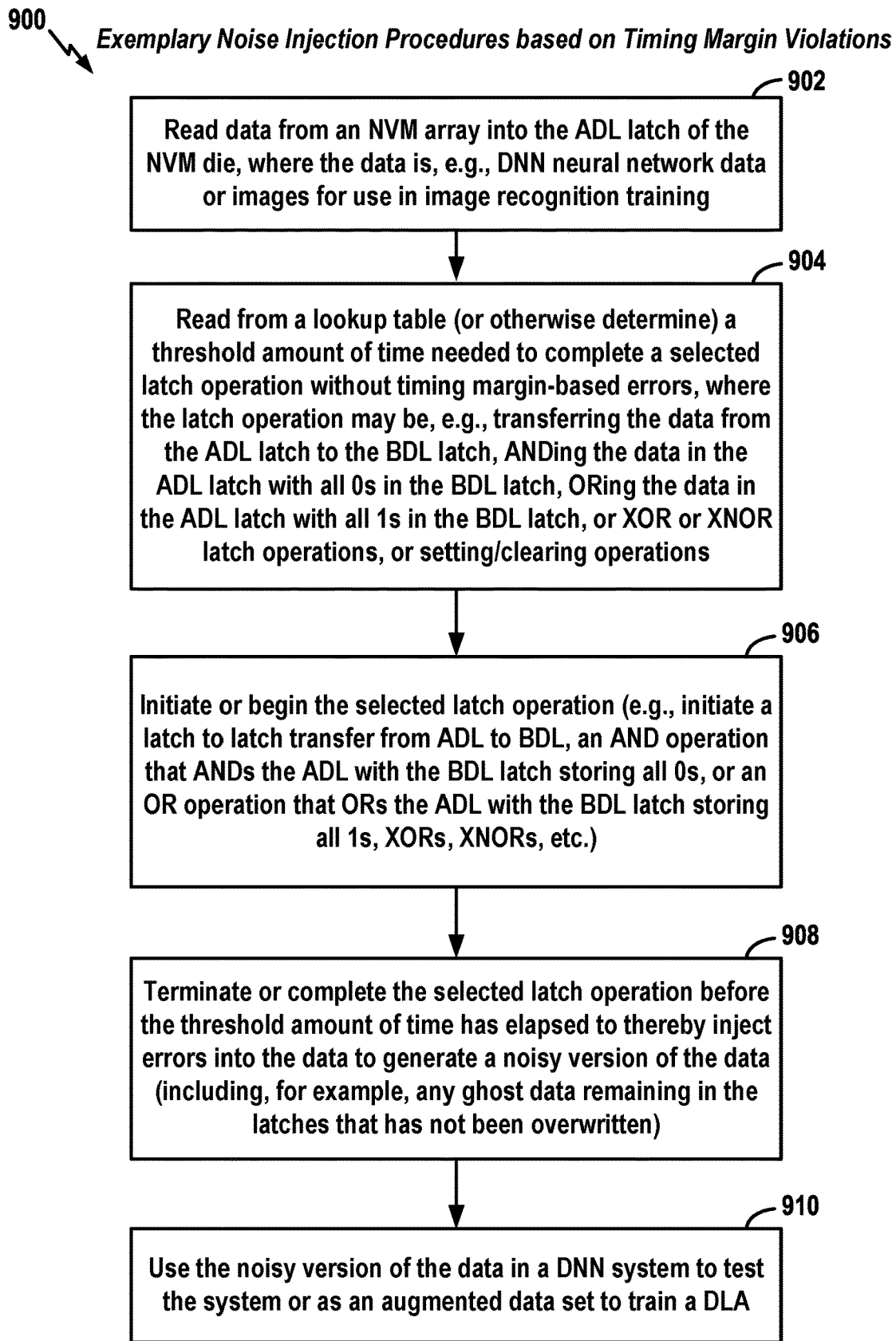
FIG. 9 is a flow chart of an exemplary latch-based procedure, according to aspects of the present disclosure, for injecting noise into data by transferring data from one latch to another without allowing sufficient time for the data to be faithfully transferred based on the timing margins of the transfer circuitry.

FIG. 9 summarizes a latch-based procedure 900 for injecting noise into data by transferring data from one latch to another without allowing sufficient time for the data to be properly and/or faithfully transferred based on the timing constraints/margins of the transfer circuitry. For example, if the circuitry requires some minimum amount of time to faithfully transfer data from one latch to another (due to, e.g., practical limitations imposed by the inductance, capacitance, and/or resistance of the circuitry and where such timing requirements may sometimes be referred to as setup and hold times), the data may be transferred from one latch to another and then read out before the amount of time has elapsed so that some bits will not be properly transferred, resulting in errors in the data and thereby noise in the data. In other examples, the circuitry is logic circuitry (e.g., XOR circuits, AND circuits, etc.) connected to the latches and the logic operations are terminated before they can faithfully complete their logic operations. This process may be referred to as data fuzzing.

Beginning at block 902, the latch-based noise injection circuitry 210 of FIG. 2 (or another suitable component) loads data (obtained, e.g., from the NVM array 204 of FIG. 2) into the ADL latch of the NVM die. The data may be for example, DNN data such as neural network data or images for use in image recognition training. At block 904, the noise injection circuitry 210 reads from a lookup table (or otherwise calculates or determines) a minimum threshold amount of time needed to complete a selected latch operation without timing margin-based errors (e.g., a sufficient time for the latch operation circuitry to properly settle). The selected latch operation may be, e.g., transferring data from the ADL latch to the BDL latch, ANDing data in the ADL latch with all 0s in the BDL latch, ORing data in the ADL latch with all 1s in the BDL latch, performing XOR or XNOR operations, or setting/clearing latch operations.

For example, during design and testing of the latch circuitry of the NVM die, the minimum timing margins or constraints may be measured or otherwise determined for particular latch operations, with the values stored in a lookup table on the NVM die. Ordinarily, such data is measured and recorded so that the circuitry will not be clocked too fast. That is, timing thresholds are specified so that circuitry does not attempt to perform operations faster the timing threshold permits. With the procedure of FIG. 9, the thresholds are used for the opposite purpose: so operations will be performed faster than the timing threshold permits.

At block 906, the noise injection circuitry 210 initiates or begins the selected latch operation (e.g., initiate a latch to latch transfer from ADL to BDL, an AND operation that ANDs the ADL with the BDL latch storing all 0s, or an OR operation that ORs the ADL with the BDL latch storing all 1s, XORs, NORs, NANDs, etc.). At block 908, the noise injection circuitry 210 terminates or complete the selected latch operation before the threshold amount of time has elapsed to thereby inject errors into the data to generate noisy data. One way of terminating or completing the latch operation before the threshold amount of time has elapsed is to clock the circuitry faster than the timing margin specifications permit. In such an example, the threshold amount of time may be specified in terms of a threshold clock rate with the latch circuitry then clocked at a faster rate (e.g., overclocked) to inject the noise. Note that, depending on the particular latch operation, the noisy data may include any ghost data remaining in the latches that has not been overwritten. At block 910, components on the NVM die (or components within the data storage controller or host) use the noisy version of the data in a DNN system, e.g., to test the system or for use as an augmented data set to train a DLA.

Insofar as the particular latch and/or logic operations are concerned, if data in one latch is ANDed with all 0s data (in a second latch), then the result will only have a subset of the bits converted to 0s. The noisy version of the data may be compared with the original correct data (using procedures described above with reference to FIG. 3) to determine an amount of noise injected. The timing and/or clock rate may then be adjusted to increase or decrease the amount of noise so as to achieve a target amount of noise injection/information degradation. If data in one latch is ORed with all 1s data (in a second latch), then the result will only have a subset of the bits converted to 1s. Additionally or alternatively, depending on the latch architecture, the circuit may just transfer data in one latch to another without allowing enough time for all of the transfers to complete. This causes some of the bits to transfer, but not all of them, leaving a ghost pattern from the original contents in the receiving latch (which may be, e.g., random data). As noted, there can also be XOR/XNOR operations used to flip a subset of the bits based on timing.

The noise injection procedures of FIG. 9 may be performed with partial patterns to vary the percentage of bits being altered (flipped) to achieve a target percentage. For example, only a portion of the data in a latch may be quickly transferred to another latch and then quickly transferred back, so that only that portion of the data is injected with noise. Still further, timing alterations may also be used in the setting or clearing of data to leave a subset of the bits cleared or set, thus leaving ghost patterns of the original contents. In this case, it is useful for the device to know what contents were in the latch before the operation, such as randomized data, cleared data, or set data, which firmware (FW) may track.

Note also that, as with the read voltage-based noise injection procedures of FIG. 3, the noise injected into data using the procedures of FIG. 9 might not be randomly distributed throughout the data because some bits in a latch operation may be more susceptible to timing margin errors than others. Nevertheless, there will be a random or stochastic component to the injected noise. In this regard, the state of the latches prior to latch to latch transfer may impact how long it takes to force a latch bit to a proper value, and so varying the number of ones or zeros in the data being transferred can affect how many flipped bits are generated in each state.

Exemplary Noise Injection Procedures Based on Transistor Voltage Adjustments

Figure 10:
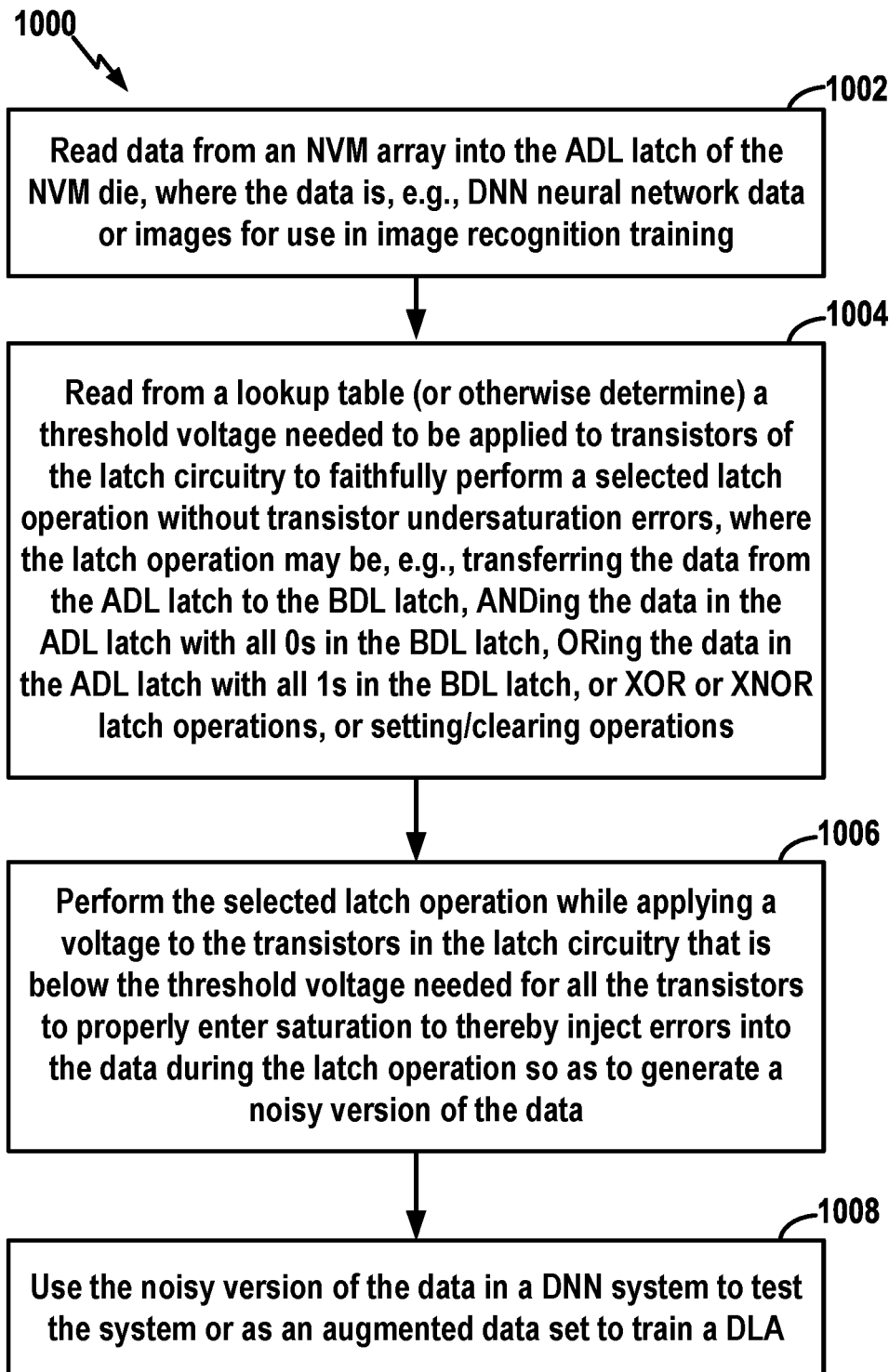
FIG. 10 is a flow chart of an exemplary latch-based procedure, according to aspects of the present disclosure, for injecting noise into data by transferring data from one latch to another without providing sufficient voltage to transistors to faithfully transfer the data based on the voltage margins of the transfer circuitry.

FIG. 10 summarizes a latch-based procedure 1000 for injecting noise into data by transferring data from one latch to another without providing sufficient voltage to circuit transistors for the data to be properly and faithfully transferred based on the voltage constraints/margins of the transistors of the transfer circuitry. For example, if the circuitry requires some minimum voltage threshold to be applied to the transistors for them to enter saturation so as to faithfully transfer data from one latch to another (imposed, e.g., by the needs of transistors to fully switch on or off), the data may be transferred from one latch to another and then read out without all of the applicable transistors receiving sufficient voltage to achieve saturation. As a result, some transistors will not properly switch and some bits will not be properly transferred from one latch to another. In other examples, the transistors are within logic circuitry (e.g., XOR circuits, AND circuits, etc.) connected to the latches and insufficient voltage is applied for the transistors for them to faithfully complete their operations. Thus, the procedure of FIG. 10 is similar in some aspects to the procedure of FIG. 9 but achieved by violating voltage margins or constraints rather than timing margins or constraints.

Beginning at block 1002, the latch-based noise injection circuitry 210 of FIG. 2 (or another suitable component) loads data (obtained, e.g., from the NVM array 204 of FIG. 2) into the ADL latch of the NVM die. The data may be for example, DNN data such as neural network data or images for use in image recognition training. At block 1004, the noise injection circuitry 210 reads from a lookup table (or otherwise calculates or determines) a minimum threshold voltage needed to be applied to transistors of the latch circuitry to properly perform a selected latch operation without transistor undersaturation errors. The selected latch operation may be, e.g., transferring data from the ADL latch to the BDL latch, ANDing data in the ADL latch with all 0s in the BDL latch, ORing data in the ADL latch with all 1s in the BDL latch, XOR or XNOR operations, or setting/clearing operations.

As with the timing margins discussed above, during design and testing of latch circuitry of the NVM die, minimum transistor voltage margins or constraints may be measured or otherwise determined for particular latch transistor operations, with the values stored in a lookup table on the NVM die. Ordinarily, such data is measured and recorded so that sufficient voltage will be properly applied to the transistors. That is, transistor voltage thresholds are specified so that circuitry does not attempt to perform operations without sufficient voltage applied to the transistors for them to enter saturation. With the procedure of FIG. 10, the thresholds are used for the opposite purpose: so insufficient voltage can be applied. (Note that by failing to provide sufficient voltage for a transistor to enter saturation, the transistor tends to operate more as a resistor than as a switch, potentially causing logic or other errors.

At block 1006, the noise injection circuitry 210 performs the selected latch operation while applying (or tuning) a voltage to the transistors in the latch circuitry that is below the threshold voltage needed for all of the transistors to properly enter saturation to thereby inject errors into the data during the latch operation so as to generate a noisy version of the data. Note again that, depending on the particular latch operation, the noisy data may include any ghost data remaining in the latches that has not been overwritten. At block 1008, components on the NVM die (or components within the data storage controller or host) use the noisy version of the data in a DNN system, e.g., to test the system or for use as an augmented data set to train a DLA.

The adjustments made to the voltages applied to the transistors may then be further adjusted (or tuned) to increase or decrease the amount of noise so as to achieve a target amount of noise injection/information degradation. The noise injection procedures of FIG. 10 may be performed with partial patterns to vary the percentage of bits being altered (flipped) to achieve a target percentage. Transistor voltage alterations may also be used in the setting or clearing of data to leave a subset of the bits cleared or set, thus leaving ghost patterns of the original contents. In this case, it is again useful for the device to know what contents were in the latch before the operation, such as randomized data, cleared data, or set data, which FW may track.

Note also that, as with the read voltage-based noise injection procedures of FIG. 3 and the timing-based noise injection procedures of FIG. 9, the noise injected into data using the procedures of FIG. 10 might not be randomly distributed throughout the data because some bits in a latch operation may be more susceptible to transistor voltage-based errors than others. Nevertheless, there will be a random or stochastic component to the injected noise.

Exemplary Noise Injection Procedures Based on Bitline Sensing

Figure 11:
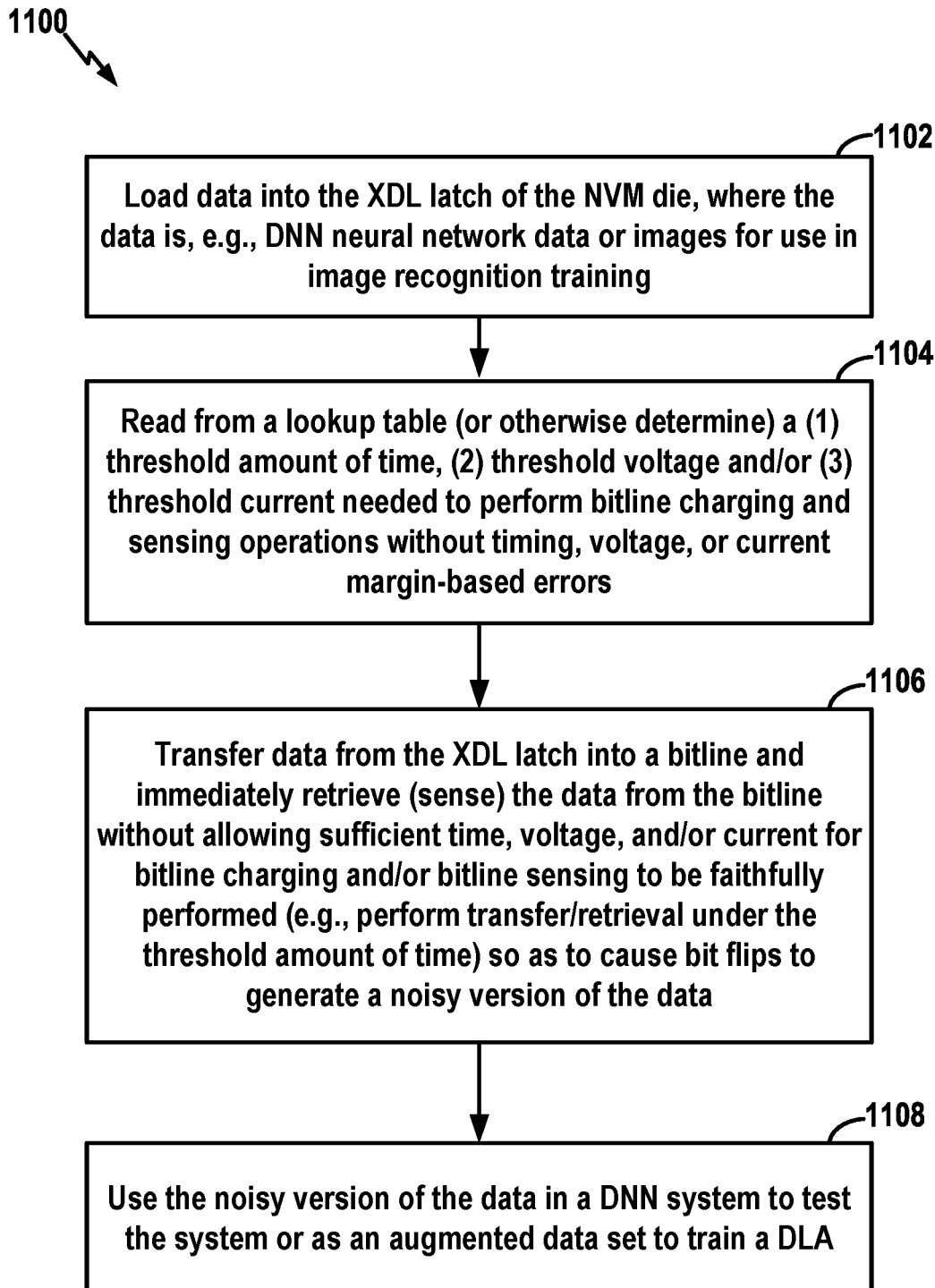
FIG. 11 is a flow chart of an exemplary latch-based procedure, according to aspects of the present disclosure, for injecting noise into data by transferring data to/from a bitline without providing sufficient time, voltage, or current to faithfully transfer the data based on the sensing/charging margins.

FIG. 11 summarizes a bitline-based procedure 1100 for injecting noise into data by transferring data from a latch to a bitline and retrieving the data from the bitline without allowing sufficient time for the bitline to be properly charged (e.g., for a bitline capacitor to properly charge) for the data to be faithfully transferred based on the timing constraints/margins pertaining to bitline charging and sensing times. This procedure is related to the procedures of FIG. 9 but applied to charging/sensing of bitlines. In this regard, noise injection components on an NVM die may take advantage of the capacitive mechanisms of latches that are connected to the bitlines. NVM die latches are capable of sensing the state of a bitline and detecting the movement of charge to/from a bitline. Such latches are also capable of charging bitlines. By reducing timing margins on the charging and sensing times, the latches can transfer a data pattern to the bitlines and pull the pattern back from the bitlines in a way that degrades the data. This is similar to the latch-to-latch transfers discussed above, except applied to bitlines, which have a capacitive component that offers possible advantages. For example, the method of FIG. 11 can be implemented on an NVM die in which latches-to-latch transfers (as in FIG. 9) might be too fast to easily modify the timing. In addition to bitline charge/sense timing changes, voltages or currents used for bitline sensing or charging may be adjusted. This may be advantageous in NVM dies where latch voltages (as in FIG. 10) might be difficult to tune.

Beginning at block 1102, the bitline-based noise injection circuitry 214 of FIG. 2 (or another suitable component) loads data (obtained, e.g., from the NVM array 204 of FIG. 2) into the XDL latch of the NVM die (assuming the data is not already in the latch). The data may be for example, DNN data such as neural network data or images for use in image recognition training. At block 1104, the noise injection circuitry 210 reads from a lookup table (or otherwise calculates or determines) a (1) threshold amount of time, (2) threshold voltage and/or (3) threshold current needed to perform bitline charging and sensing operations without timing, voltage, or current margin-based errors. For example, during design and testing of the bitline circuitry of the NVM die, the minimum timing, voltage, and current margins or constraints may be measured or otherwise determined for bitline charging and sensing operations, with the values stored in a lookup table on the NVM die.

At block 1106, the noise injection circuitry 214 transfers data from the XDL latch into a bitline and immediately retrieves (sense) the data from the bitline without allowing sufficient time, voltage, and/or current for bitline charging and/or bitline sensing to be properly performed so as to cause bit flips during the process to generate a noisy version of the data. For example, the noise injection circuitry 214 attempts to perform the transfer/retrieval to/from the bitline under the threshold amount of time specified by the stored margins/constraints.

At block 1110, components on the NVM die (or components within the data storage controller or host) use the noisy version of the data in a DNN system, e.g., to test the system or for use as an augmented data set to train a DLA.

One way of performing the bitline transfer/retrieval operation before the threshold amount of time has elapsed is to clock the bitline/latch circuitry faster than the timing margin specifications permit. In such any example, the thresholds may be specified in terms of threshold clock rates with the circuitry overclocked to inject the noise. Note that the noisy data may include some ghost data. The noise injection procedures of FIG. 11 may be performed with partial patterns to vary the percentage of bits being altered (flipped) to achieve a target percentage. For example, only a portion of the data in a latch may be quickly transferred to the bitline and then quickly retrieved, so that only that portion of the data is injected with noise.

Note that in addition to injecting errors by adjusting bitline timing, voltage, and/or current, similar procedures may be applied to wordlines, including adjusting the timing allowed for wordline voltages on the NVM array to settle. By not allowing sufficient time for the wordline voltages to settle, errors thereby may be electively injected so as to inject noise and degrade the data.

Note also that, as with some of the noise injection procedures discussed above, the noise injected into data using the procedures of FIG. 11 might not be randomly distributed throughout the data because some bits in the bitline may be more susceptible to timing margin errors than others. That is, the state of the bitline prior to the charging may impact how long it takes to force a bitline to a proper value, and so varying the number of ones or zeros in the data being transferred can affect how many noisy bits are generated in each state, in addition to changing parameters such timing, voltage, and current parameters.

Exemplary Inter-Plane Noise Injection Procedures

Figure 12:
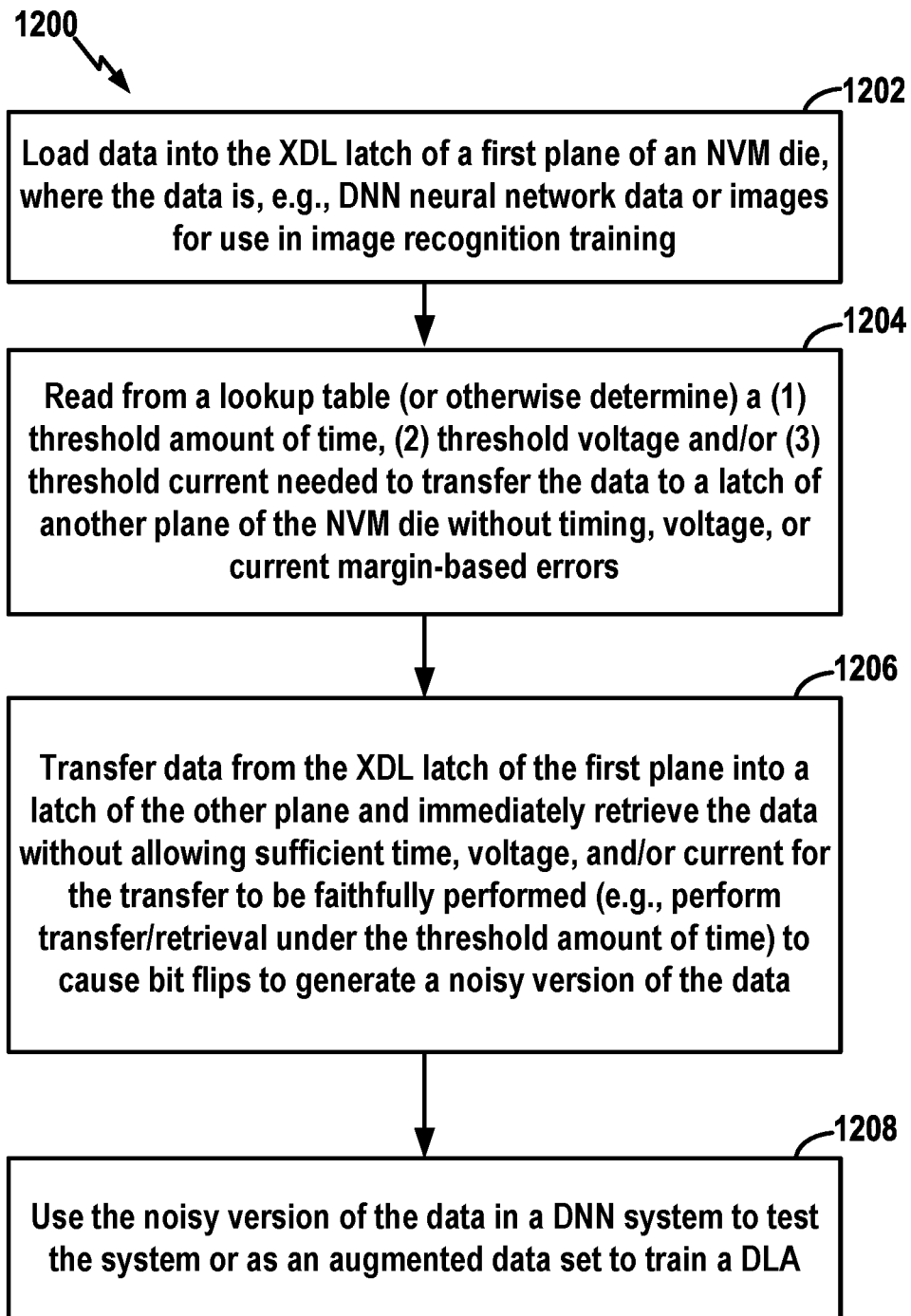
FIG. 12 is a flow chart of an exemplary latch-based procedure, according to aspects of the present disclosure, for injecting noise into data by transferring data from one plane to another in a multiplanar die without providing sufficient time, voltage, or current to faithfully transfer the data.

FIG. 12 summarizes an inter-plane procedure 1200 for injecting noise into data by transferring data from a latch on one plane of an NVM die to a latch on another plane of the die and retrieving the data without allowing sufficient time, voltage, or current for the data to be faithfully transferred based on the timing constraints/margins (or with other inter-plane operations). In this regard, an NVM die may be configured with a plurality of planes and there may be latches on each of the planes. Each plane may include at least one transfer data latch (XDL) as well as auxiliary latches (ADL, BDL, etc.). This procedure is related to the latch-to-latch transfers of FIG. 9 but performed plane-to-plane. Inter-plane transfers are generally slower than intra-plane transfers, but the inter-plane transfers may allow for better control of randomization (particularly if intra-plane latch-to-latch transfers are too fast to precisely tune the amount of randomization). Often, data transfer between the planes may be needed for other data manipulation procedures (such as during DLA procedures) and so there may not be any significant performance penalty by transferring data inter-plane while injecting noise.

Beginning at block 1202, the inter-plane-based noise injection circuitry 215 of FIG. 2 (or another suitable component) loads data into the XDL latch of a first plane of the NVM die (assuming the data is not already in the latch). The data may be for example, DNN data such as neural network data or images for use in image recognition training. At block 1204, the noise injection circuitry 215 reads from a lookup table (or otherwise calculates or determines) a (1) threshold amount of time, (2) threshold voltage and/or (3) threshold current needed to transfer the data to a latch of another (second) plane without timing, voltage, or current margin-based errors. For example, during design and testing of the inter-plane communication circuitry of the NVM die, the minimum timing, voltage, and current margins or constraints may be measured or otherwise determined, with the values stored in a lookup table on the NVM die.

At block 1206, the noise injection circuitry 215 transfers data from the XDL latch of the first plane into a latch of the other (second) plane and immediately retrieves the data from the latch of the other plane without allowing sufficient time, voltage, and/or current for the transfer to be faithfully performed so as to cause bit flips during the process to generate a noisy version of the data. At block 1210, components on the NVM die (or components within the data storage controller or host) use the noisy version of the data in a DNN system, e.g., to test the system or for use as an augmented data set to train a DLA. In other examples, rather than immediately retrieving the data back into the latch of the first plane, the data in the latch of second plane is simply read out and used as noisy data. The one way transfer of data from the first plane to the second is sufficient will likely inject less noise into the data then a round-trip transfer.

One way of performing a transfer/retrieval operation before the threshold amount of time has elapsed is to clock the inter-plane IO circuitry faster than the timing margin specifications permit. In such any example, the thresholds may be specified in terms of threshold clock rates with the IO circuitry overclocked to inject the noise. Note that the noisy data may include some ghost data. The noise injection procedures of FIG. 12 may be performed with partial patterns to vary the percentage of bits being altered (flipped) to achieve a target percentage. For example, only a portion of the data in a latch may be quickly transferred to the bitline and then quickly retrieved, so that only that portion of the data is injected with noise.

Note also that, as with some of the noise injection procedures discussed above, the noise injected into data using the procedures of FIG. 12 might not be randomly distributed throughout the data because some bits in the bitline may be more susceptible to timing margin errors than others. That is, the state of the bitline prior to the charging may impact how long it takes to force a bitline to a proper value, and so varying the number of ones or zeros in the data being transferred can affect how many noisy bits are generated in each state, in addition to changing parameters such timing, voltage, and current parameters.

Thus, in some examples, data may be transferred from one plane to another and then immediately retrieved without allowing sufficient time for the data to be faithfully transferred. Alternatively, current or voltage margins may be pushed into territory where the data transfer becomes less reliable. This may entail transistor-specific behaviors, such that some bits may be more susceptible to flipping than others. (The bits that are transferred before or after a particular bit may influence the value of that particular bit, and the susceptibility of that particular bit to flip.) Note also that data communication/transfers between planes can be performed on the byte level or by transferring many bytes at the same time. In some standard NAND-based NVM die architectures, all planes connect at the input outputs (IOs), and so it may be easiest to transfer between planes at the byte level. However, due to the fanout and routing of the bytes, and the interfacing with slower circuits, it is possible that multibyte transfers may be performed (assuming sufficient space to route the additional traces).

In the following, various general exemplary procedures and systems are described.

Exemplary Data Storage Device Die

Figure 13:
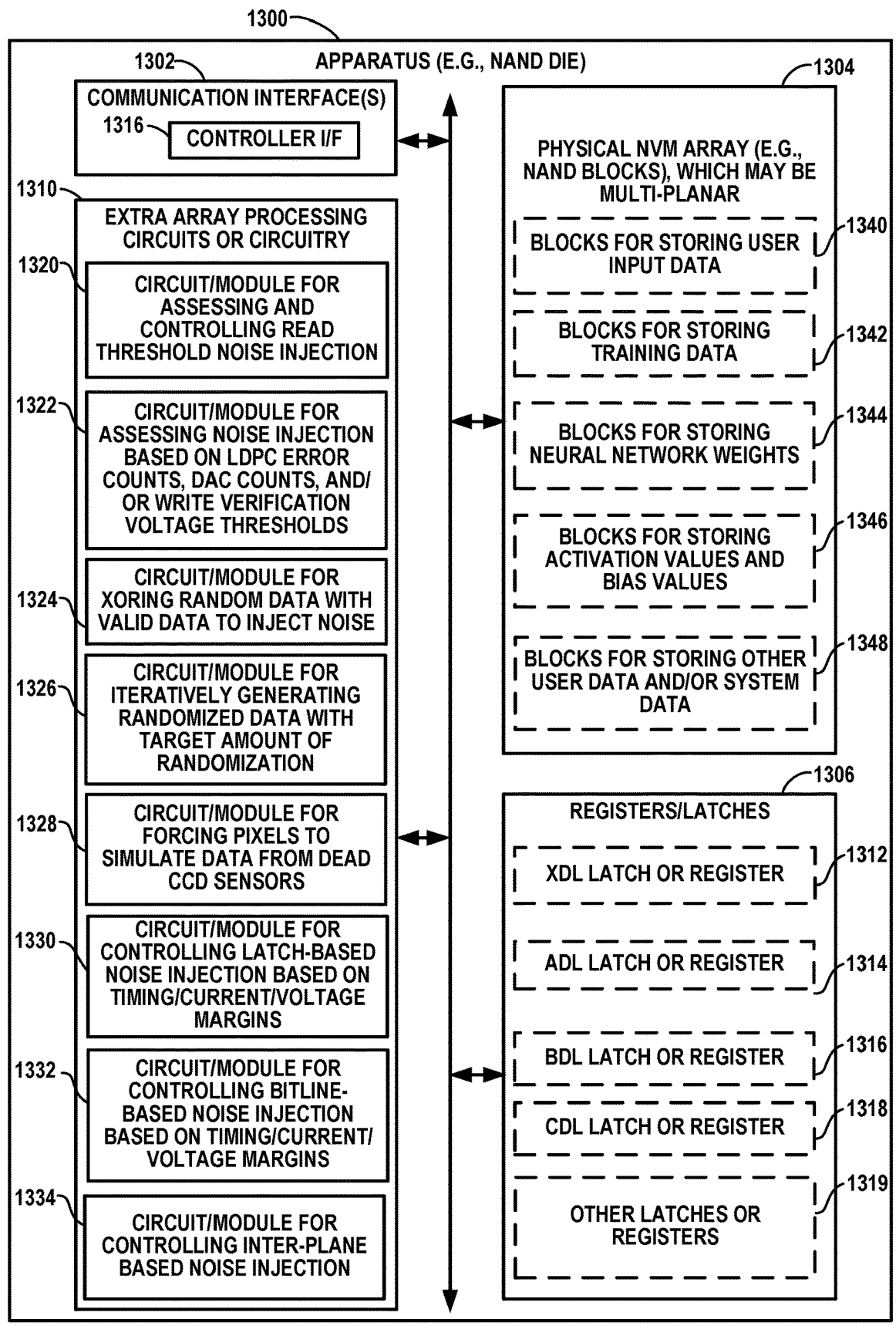
FIG. 13 is a schematic block diagram configuration, according to aspects of the present disclosure, for an exemplary NVM apparatus such as a NAND die having circuits and latches for performing noise injection operations.

FIG. 13 illustrates an embodiment of an apparatus 1300 configured according to one or more aspects of the disclosure. The apparatus 1300, or components thereof, could embody or be implemented within a NAND die or some other type of NVM device that supports data storage. In various implementations, the apparatus 1300, or components thereof, could be a component of a processor, a controller, a computing device, a personal computer, a portable device, or workstation, a server, a personal digital assistant, a digital camera, a digital phone, an entertainment device, a medical device, a self-driving vehicle control device, or any other electronic device that stores, processes or uses neural network data. (In some aspects, the apparatus is instead a volatile memory chip with a volatile memory data storage array, and the data is not necessarily neural network weight but other types of data.)

The apparatus 1300 includes a communication interface 1302, a physical memory array (e.g., NAND blocks) 1304, a set of registers and/or latches 1306, and extra-array processing circuits or circuitry 1310 (e.g., circuitry formed on the same die that includes the NVM array). These components can be coupled to and/or placed in electrical communication with one another via suitable components, represented generally by the connection lines in FIG. 13. Although not shown, other circuits such as timing sources, peripherals, voltage regulators, and power management circuits may be provided, which are well known in the art, and therefore, will not be described any further.

The communication interface 1302 provides a means for communicating with other apparatuses over a transmission medium. In some implementations, the communication interface 1302 includes circuitry and/or programming (e.g., a program) adapted to facilitate the communication of information bi-directionally with respect to one or more devices in a system. In some implementations, the communication interface 1302 may be configured for wire-based communication. For example, the communication interface 1302 could be a bus interface, a send/receive interface, or some other type of signal interface including circuitry for outputting and/or obtaining signals (e.g., outputting signal from and/or receiving signals into an SSD). The communication interface 1302 serves as one example of a means for receiving and/or a means for transmitting.

The physical memory array 1304 may represent one or more NAND blocks. The physical memory array 1304 may be used for storing data such as neural network weights (or synaptic weights) that are manipulated by the processing circuits 1310 or some other component of the apparatus 1300. The physical memory array 1304 may be coupled to the processing circuits 1310 (via, e.g., registers/latches 1306) such that the processing circuits 1310 can read or sense information from, and write or program information to, the physical memory array 1304 (via, e.g., registers/latches 1306). That is, the physical memory array 1304 can be coupled to the processing circuits 1310 so that the physical memory array 1304 is accessible by the processing circuits 1310. The registers/latches 1306 may include one or more of: an XDL latch 1312; an ADL latch 1314; a BDL latch 1316; a CDL latch 1318, and one or more other latches or registers 1319, such as a sensing latch, SEN. The NVM array 1304 may include one or more of: blocks 1340 for storing user input data; blocks 1342 for storing training data;

blocks 1344 for storing neural network weights; blocks 1346 for storing activation values and bias values; and blocks 1348 for storing other user data and/or system data. The NVM die may have multiple planes, each of which may have its own physical NVM array and set of registers and latches. As such, the NVM array may be a multi-planar array.

The processing circuits 1310 are arranged or configured to obtain, process and/or send data, control data access and storage, issue or respond to commands, and control other desired operations. For example, the processing circuits 1310 may be implemented as one or more processors, one or more controllers, and/or other structures configured to perform functions.

According to one or more aspects of the disclosure, the processing circuits 1310 may be adapted to perform any or all of the features, processes, functions, operations and/or routines described herein. For example, the processing circuits 1310 may be configured to perform any of the steps, functions, and/or processes described with respect to FIG. 3 and FIG. 10 (described below). As used herein, the term "adapted" in relation to the processing circuit 1310 may refer to the processing circuits 1310 being one or more of configured, employed, implemented, and/or programmed to perform a particular process, function, operation and/or routine according to various features described herein. The processing circuits 1310 may include a specialized processor, such as an application specific integrated circuit (ASIC) that serves as a means for (e.g., structure for) carrying out any one of the operations described in conjunction with FIG. 3-12 and FIGS. 17, 21, 25, and 29, described below. The processing circuits 1310 serves as one example of a means for processing. In various implementations, the processing circuits 1310 may provide and/or incorporate, at least in part, the functionality described above for the processing components of FIG. 2 and FIGS. 14-16, 18-20, 22-24, and 26-28 described below.

According to at least one example of the apparatus 1300, the processing circuitry 1310 may include one or more of: a circuit/module 1320 configured for assessing and controlling read threshold noise injection (in accordance with, for example, the procedures of FIG. 3); a circuit/module 1322 configured for assessing noise injection based on LDPC error counts, DAC counts, and/or write verification voltage thresholds (in accordance with, for example, the procedures of FIG. 4); a circuit/module 1324 configured for XORing random data with valid data to inject noise (in accordance with, for example, the procedures of FIG. 5); a circuit/module 1326 configured for iteratively generating randomized data with a target amount of randomization (in accordance with, for example, the procedures of FIG. 6); a circuit/module 1328 configured for forcing pixels to simulate data from dead CCD sensors (in accordance with, for example, the procedures of FIGS. 7-8); a circuit/module 1330 configured for controlling latch-based noise injection based on timing/current/voltage margins (in accordance with, for example, the procedures of FIGS. 9-10); a circuit/module 1332 configured for controlling bitline-based noise injection based on timing/current/voltage margins (in accordance with, for example, the procedures of FIG. 11); and a circuit/module 1334 configured for controlling inter-plane based noise injection (in accordance with, for example, the procedures of FIG. 12).

In at least some examples, means may be provided for performing the functions illustrated in FIG. 13 and/or other functions illustrated or described herein. For example, the means may include one or more of: means, such as circuit/module 1320, for assessing and controlling read threshold noise injection (in accordance with, for example, the procedures of FIG. 3); means, such as circuit/module 1322, for assessing noise injection based on LDPC error counts, DAC counts, and/or write verification voltage thresholds (in accordance with, for example, the procedures of FIG. 4); means, such as circuit/module 1324, for XORing random data with valid data to inject noise (in accordance with, for example, the procedures of FIG. 5); means, such as circuit/module 1326, for iteratively generating randomized data with a target amount of randomization (in accordance with, for example, the procedures of FIG. 6); means, such as circuit/module 1328, for forcing pixels to simulate data from dead CCD sensors (in accordance with, for example, the procedures of FIGS. 7-8); means, such as circuit/module 1330, for controlling latch-based noise injection based on timing/current/voltage margins (in accordance with, for example, the procedures of FIGS. 9-10); means, such as circuit/module 1332, for controlling bitline-based noise injection based on timing/current/voltage margins (in accordance with, for example, the procedures of FIG. 11); and means, such as circuit/module 1334, for controlling inter-plane based noise injection (in accordance with, for example, the procedures of FIG. 12).

Additional Exemplary Methods and Embodiments

Figure 14:
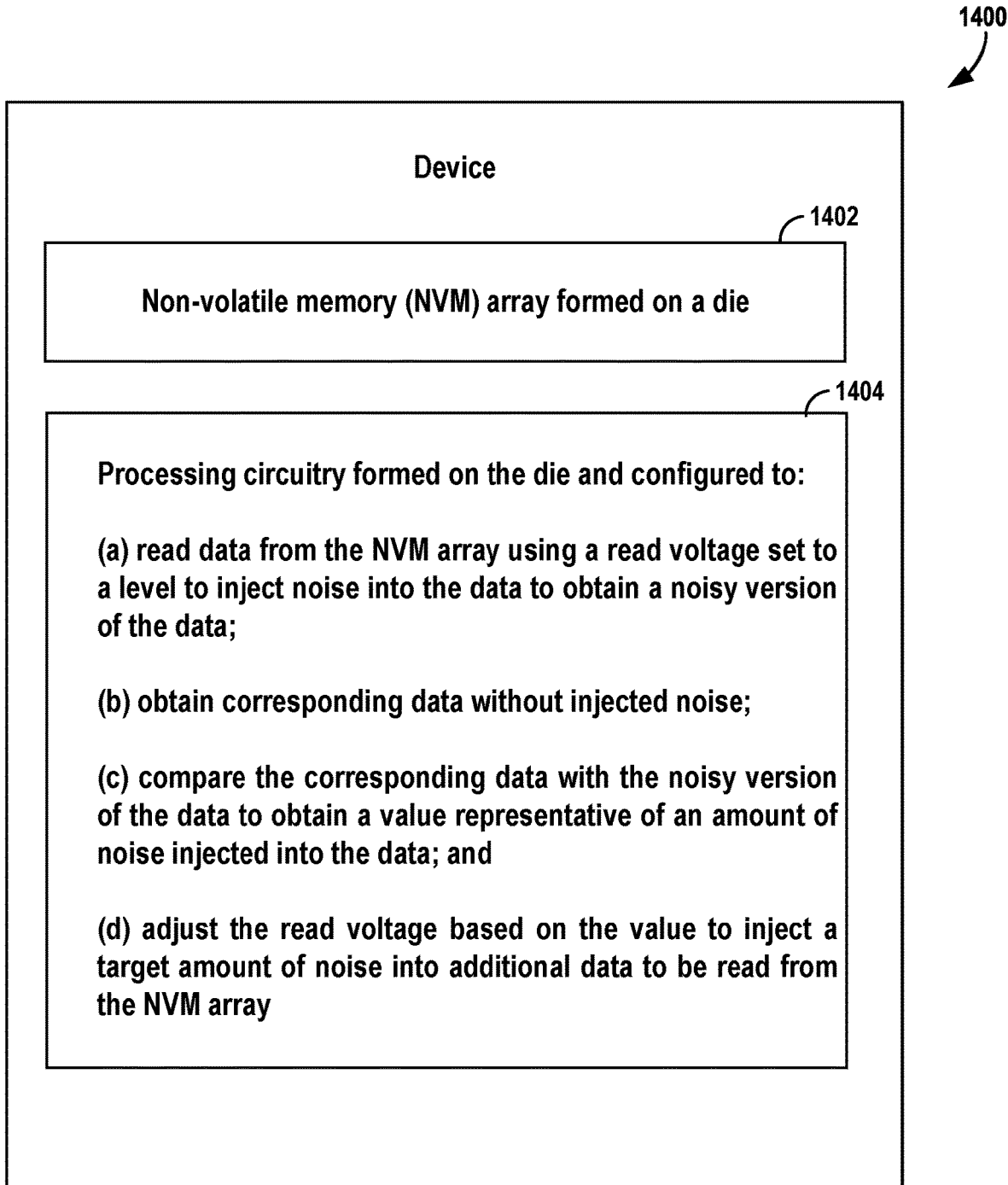
FIG. 14 is block diagram illustrating an exemplary device, according to aspects of the present disclosure, having an NVM array, according to aspects of the present disclosure, wherein a read voltage is set to inject noise into the data to obtain a noisy version of the data.

FIG. 14 is a block diagram of a device 1400 in accordance with some aspects of the disclosure. The device 1400 (which may be a data storage device) includes an NVM array 1402 formed on a die, and a processing circuit or processing circuitry 1404 formed on the die and configured to: (a) read data from the NVM array using a read voltage set to a level to inject noise into the data to obtain a noisy version of the data; (b) obtain corresponding data without injected noise; (c) compare the corresponding data with the noisy version of the data to obtain a value representative of an amount of noise injected into the data; and (d) adjust the read voltage based on the value to inject a target amount of noise into additional data to be read from the NVM array. See, for example, the devices of FIGS. 2 and 13, described above.

Figure 15:
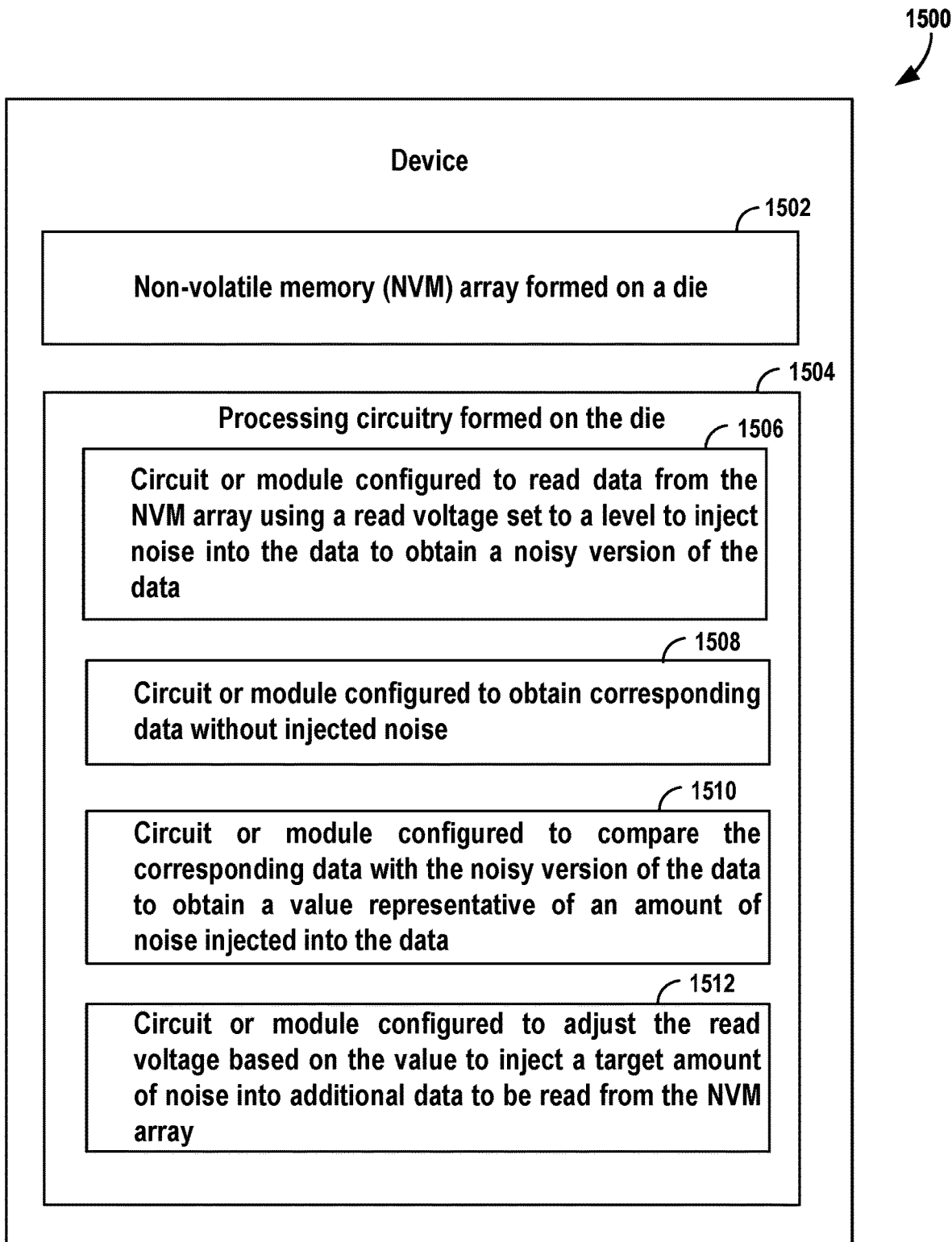
FIG. 15 is block diagram illustrating an exemplary device, according to aspects of the present disclosure, wherein a read voltage is set to inject noise into the data to obtain a noisy version of the data, and particularly illustrating different circuit components.

FIG. 15 is a block diagram of a device 1500 in accordance with some aspects of the disclosure. The device 1500 (which may be a data storage device) includes an NVM array 1502 formed on a die, and a processing circuit or processing circuitry 1504 formed on the die. The processing circuitry 1504 includes: a circuit or module 1506 configured to read data from the NVM array using a read voltage set to a level to inject noise into the data to obtain a noisy version of the data; a circuit or module 1508 configured to obtain corresponding data without injected noise; a circuit or module 1510 configured to compare the corresponding data with the noisy version of the data to obtain a value representative of an amount of noise injected into the data; and a circuit 1512 or module configured to adjust the read voltage based on the value to inject a target amount of noise into additional data to be read from the NVM array. See, for example, the devices of FIGS. 2 and 13, described above.

In at least some examples, means may be provided for performing the functions illustrated in FIG. 15 and/or other functions illustrated or described herein. For example, the means may include one or more of: means, such as circuit/module 1506, for reading data from the NVM array using a read voltage set to a level to inject noise into the data to obtain a noisy version of the data; means, such as circuit/module 1508, for obtaining corresponding data without injected noise from a host or data storage controller; means, such as circuit/module 1510, for comparing the corresponding data with the noisy version of the data to obtain a value representative of an amount of noise injected into the data; and means, such as circuit/module 1512, for adjusting the read voltage based on the value to inject a target amount of noise into additional data to be read from the NVM array.

Figure 16:
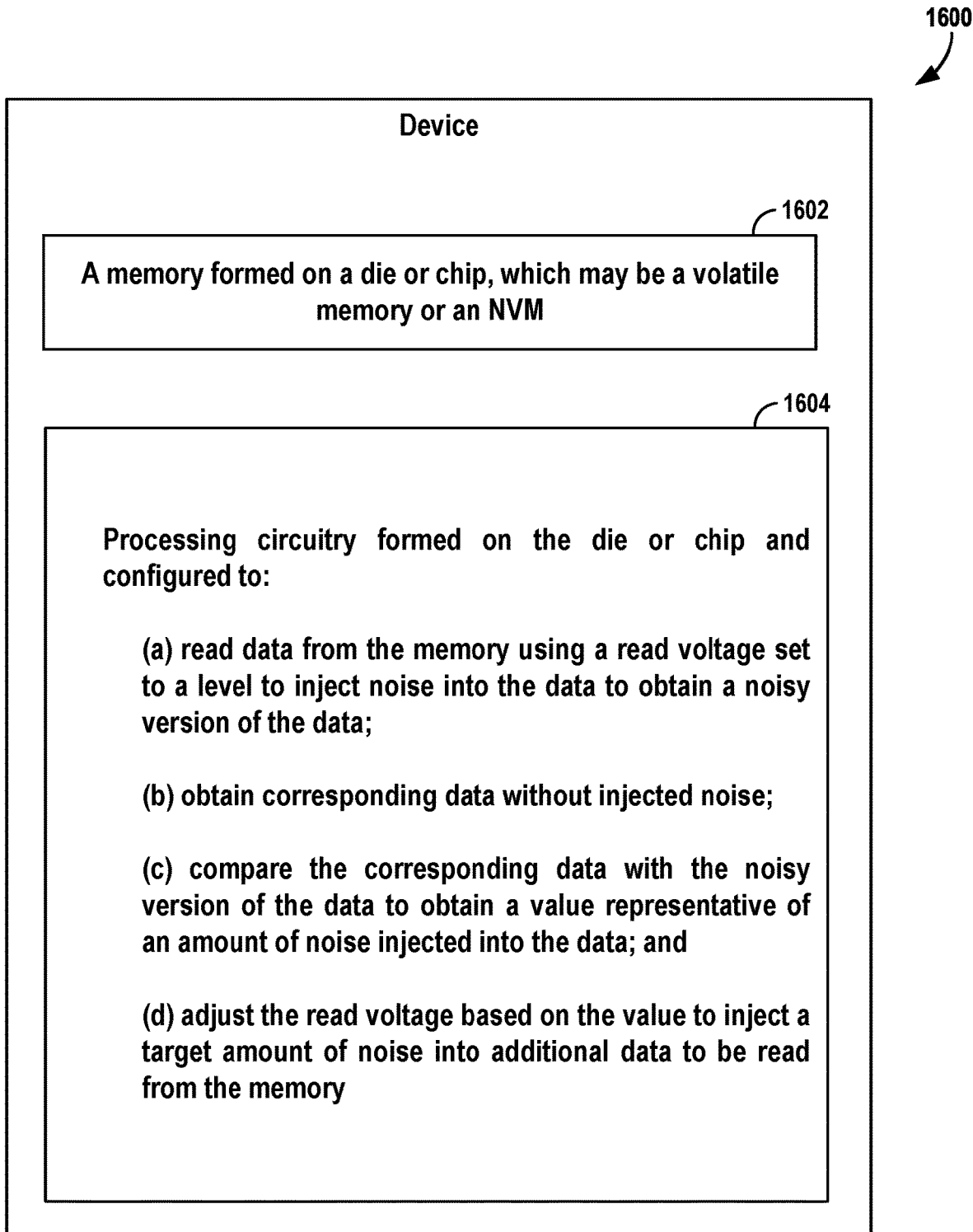
FIG. 16 is block diagram illustrating an exemplary device, according to aspects of the present disclosure, having a memory, wherein a read voltage is set to inject noise into the data to obtain a noisy version of the data, and wherein the memory may be volatile or non-volatile.

FIG. 16 is a block diagram of a device 1600 that includes a memory 1602 formed on a die or chip. The device 1600 (which may be a data storage device) also includes a processing circuit or processing circuitry 1602 formed on the die or chip and configured to: (a) read data from the memory using a read voltage set to a level to inject noise into the data to obtain a noisy version of the data; (b) obtain corresponding data without injected noise; (c) compare the corresponding data with the noisy version of the data to obtain a value representative of an amount of noise injected into the data; and (d) adjust the read voltage based on the value to inject a target amount of noise into additional data to be read from the memory. The memory may be volatile or non-volatile.

Figure 17:
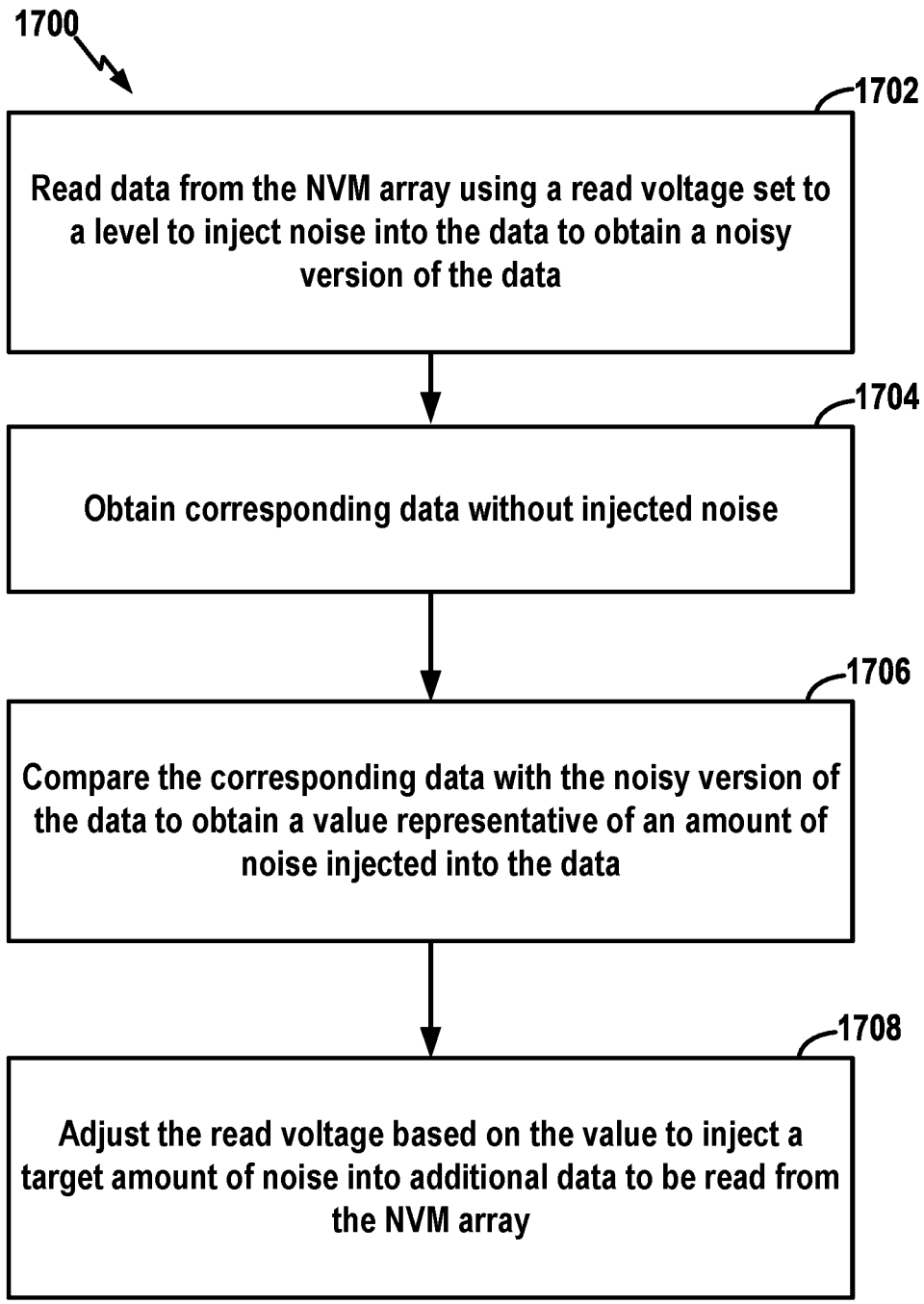
FIG. 17 is a flow chart of an exemplary method, according to aspects of the present disclosure, wherein a read voltage is set to inject noise into the data to obtain a noisy version of the data.

FIG. 17 illustrates a method or process 1700 in accordance with some aspects of the disclosure. The process 1700 may take place within any suitable device (which may be a data storage device) or apparatus capable of performing the operations, such as a NAND die configured with appropriate processing circuitry. See, for example, the devices of FIGS. 2, 13, 14 and 15, described above. At block 1702, the device reads data, such as DNN data, from the NVM array using a read voltage set to a level to inject noise into the data to obtain a noisy version of the data. At block 1704, the device obtains corresponding data without injected noise, such as data that is known to be correct. At block 1706, the device compares the corresponding data with the noisy version of the data to obtain a value representative of an amount of noise injected into the data, such as count of bitflip differences obtained by XORing a correct version of the data with the noisy version of the data. At block 1708, the device adjusts the read voltage based on the value to inject a target amount of noise into additional data to be read from the NVM array, such as by adjusting the read voltage to achieve a 10% error rate in data read from the same block of the NVM array. The data may be, for example, DNN data and the noisy version of the data may be used as part of an augmented DNN data set for training a DNN using a DLA, or for use is testing a trained DNN. See, for example, the method of FIG. 3, described above.

Figure 18:
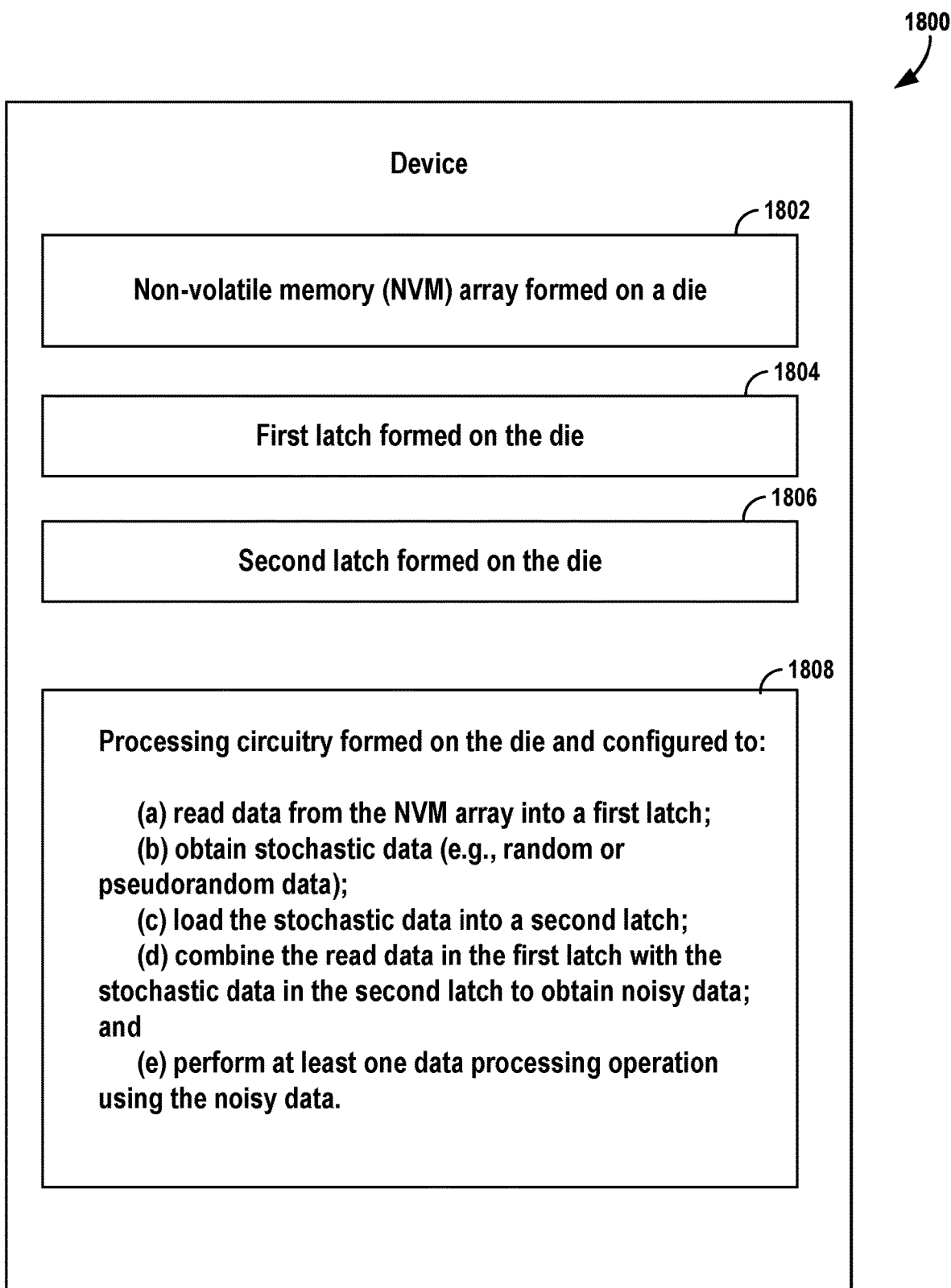
FIG. 18 is block diagram illustrating an exemplary device having an NVM array, according to aspects of the present disclosure, wherein read data may be combined with stochastic data (e.g., random or pseudorandom data) to generate noisy data.

FIG. 18 is a block diagram of a device 1800 in accordance with some aspects of the disclosure. The device 1800 (which may be a data storage device) includes an NVM array 1802 formed on a die, a first latch 1804 formed on the die, a second latch 1806 formed on the die, and a processing circuit or processing circuitry 1808 formed on the die and configured to: (a) read data from the NVM array into a first latch; (b) obtain stochastic data; (c) load the stochastic data into a second latch; (d) combine the read data in the first latch with the stochastic data in the second latch to obtain noisy data; and (e) perform at least one data processing operation using the noisy data. See, for example, the devices of FIGS. 2 and 13, described above.

Figure 19:
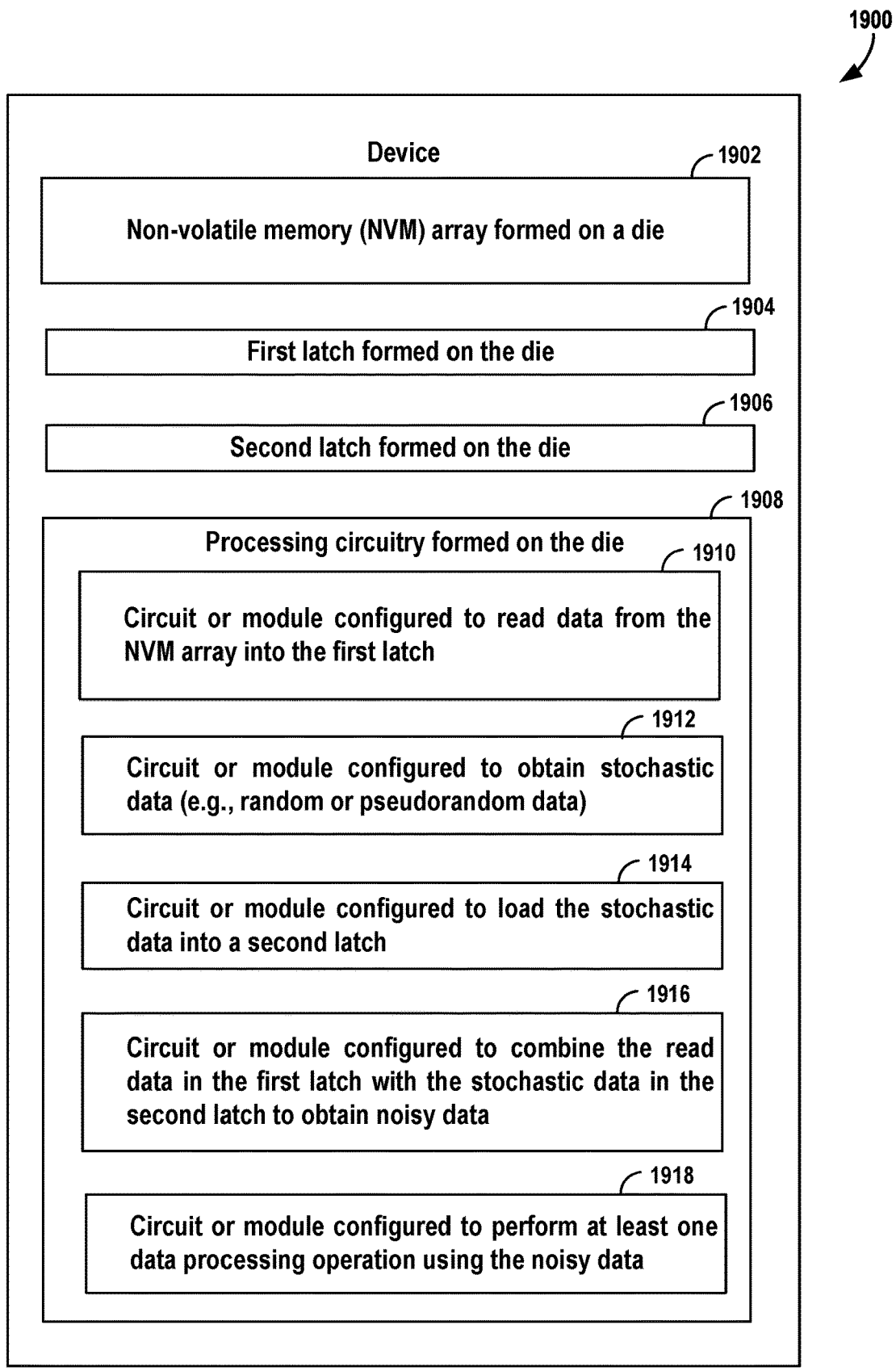
FIG. 19 is block diagram illustrating an exemplary device, according to aspects of the present disclosure, wherein read data may be combined with stochastic data to generate noisy data, and particularly illustrating different circuit components.

FIG. 19 is a block diagram of a device 1900 in accordance with some aspects of the disclosure. The device 1900 (which may be a data storage device) includes an NVM array 1902 formed on a die, a first latch 1904 formed on the die, a second latch 1906 formed on the die, and processing circuit or processing circuitry 1908 formed on the die. The processing circuitry 1908 includes: a circuit or module 1910 configured to read data from the NVM array using a read voltage set to a level to inject noise into the data to obtain a noisy version of the data; a circuit or module 1912 configured to corresponding data without injected noise; a circuit or module 1914 configured to compare the corresponding data with the noisy version of the data to obtain a value representative of an amount of noise injected into the data; a circuit or module 1916 configured to adjust the read voltage based on the value to inject a target amount of noise into additional data to be read from the NVM array. See, for example, the devices of FIGS. 2 and 13, described above.

In at least some examples, means may be provided for performing the functions illustrated in FIG. 19 and/or other functions illustrated or described herein. For example, the means may include one or more of: means, such as circuit/module 1910, for read data from the NVM array into a first latch; means, such as circuit/module 1912, for obtaining stochastic data; means, such as circuit/module 1914, for loading the stochastic data into a second latch; means, such as circuit/module 1916, for combining the read data in the first latch with the stochastic data in the second latch to obtain noisy data; and means, such as circuit/module 1918, for performing at least one data processing operation using the noisy data.

Figure 20:
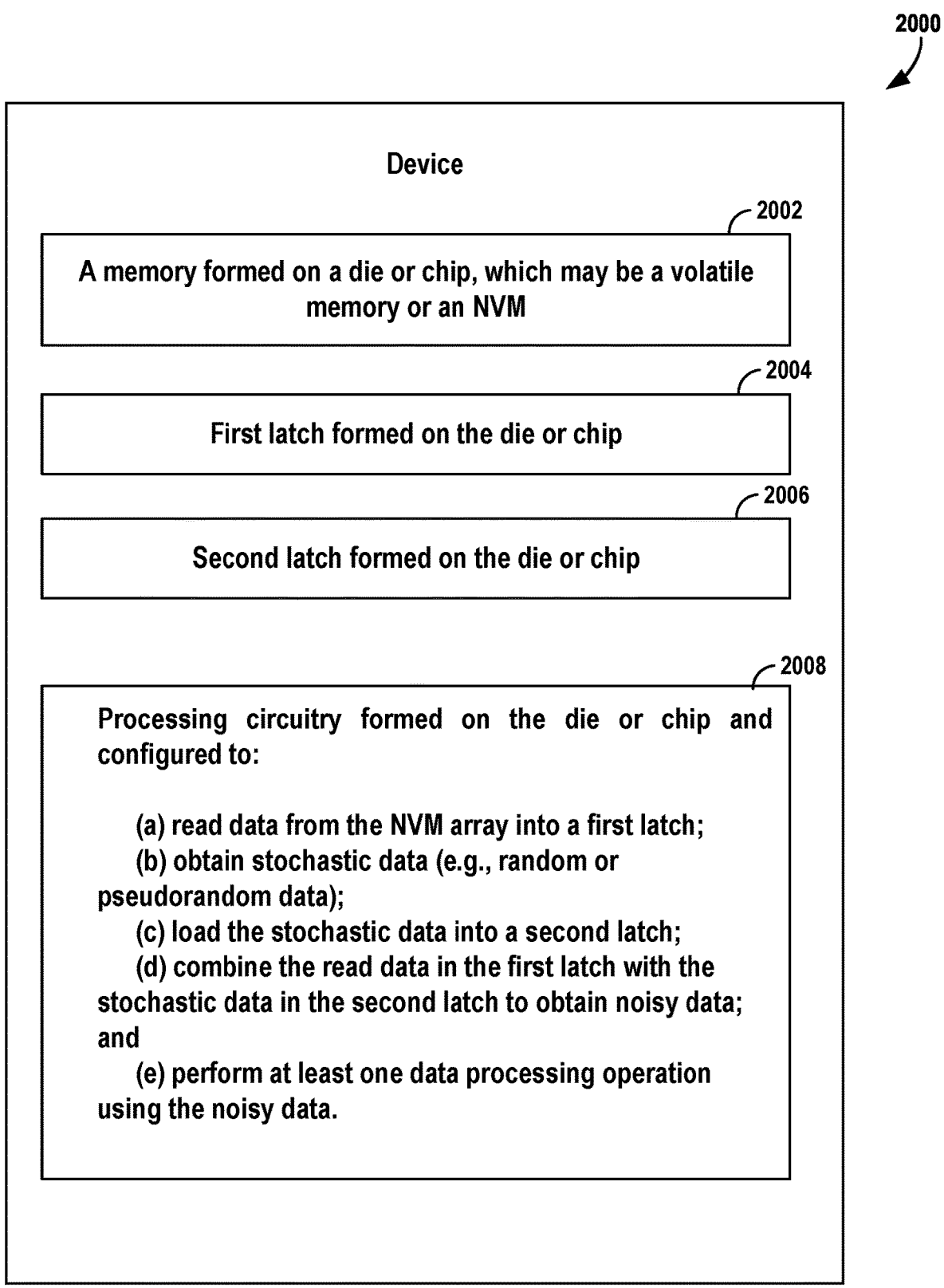
FIG. 20 is block diagram illustrating an exemplary device, according to aspects of the present disclosure having a memory, wherein read data may be combined with stochastic data (e.g., random or pseudorandom data) to generate noisy data, and wherein the memory may be volatile or non-volatile.

FIG. 20 is a block diagram of a device 2000 that includes a memory 2002 formed on a die or chip. The device 2000 (which may be a data storage device) also includes a first latch 2004 formed on the die or chip, a second latch 2006 formed on the die or chip, and processing circuit or processing circuitry 2008 formed on the die or chip. The processing circuitry 2008 is configured to: (a) read data from the NVM array into a first latch; (b) obtain stochastic data; (c) load the stochastic data into a second latch; (d) combine the read data in the first latch with the stochastic data in the second latch to obtain noisy data; and (e) perform at least one data processing operation using the noisy data. The memory may be volatile or non-volatile.

Figure 21:
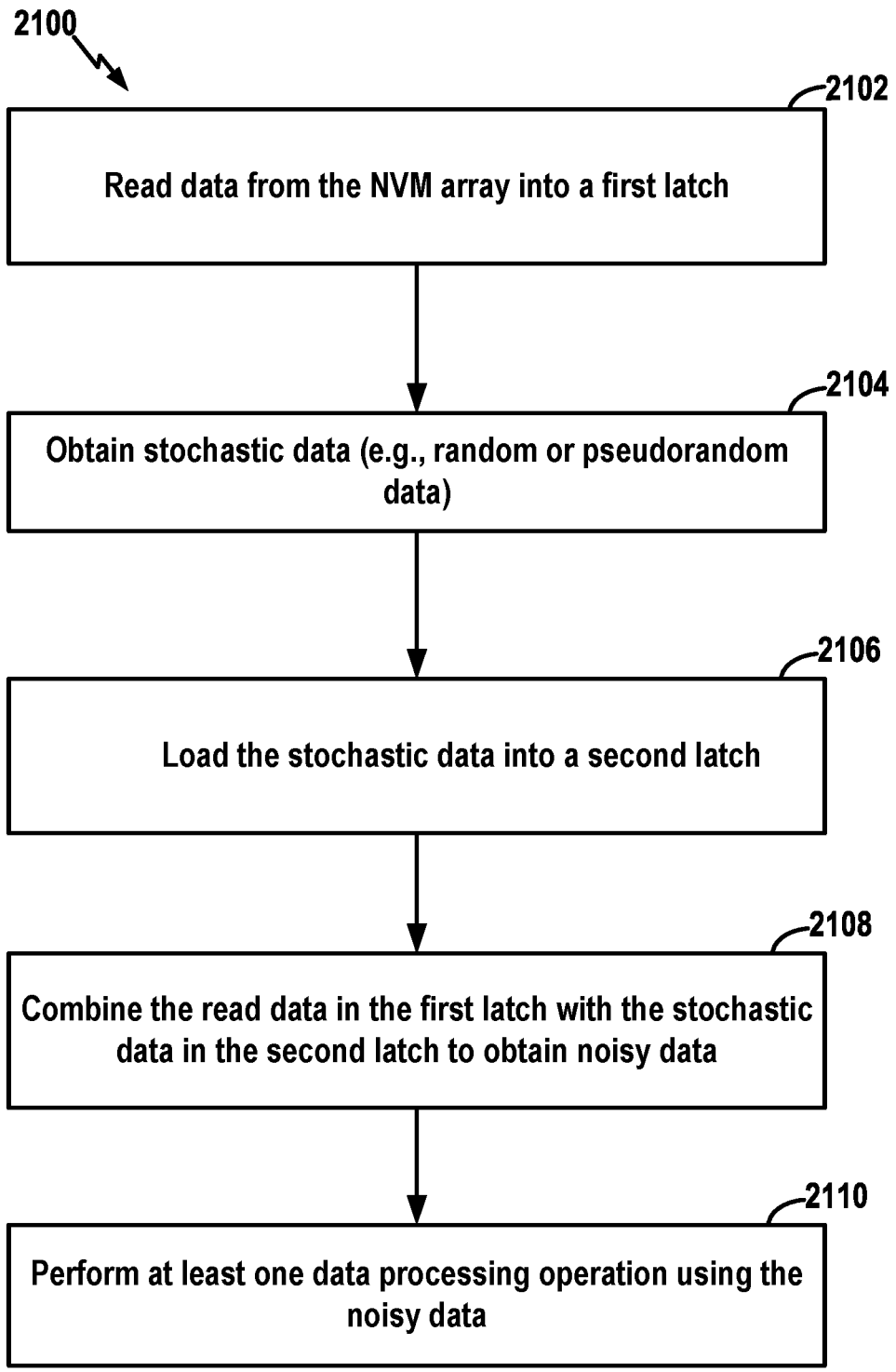
FIG. 21 is a flow chart of an exemplary method, according to aspects of the present disclosure, wherein read data may be combined with stochastic data (e.g., random or pseudo-random data) to generate noisy data.

FIG. 21 illustrates a method or process 2100 in accordance with some aspects of the disclosure. The process 2100 may take place within any suitable device (which may be a data storage device) or apparatus capable of performing the operations, such as a NAND die configured with appropriate processing circuitry. See, for example, the devices of FIGS. 2, 13, 18 and 19, described above. At block 2102, the device reads data into a first latch, such as DNN data, from the NVM array. At block 2104, the device obtains stochastic data (e.g., random or pseudorandom data). At block 2106, the device loads the stochastic data into a second latch. At block 2108, the device combines (e.g., XORs) the read data in the first latch with the stochastic data in the second latch to obtain noisy data. At block 2110, the device performs at least one data processing operation using the noisy data, such as a machine learning operation or a DNN operation. See, for example, the method of FIGS. 5 and 6, described above.

Figure 22:
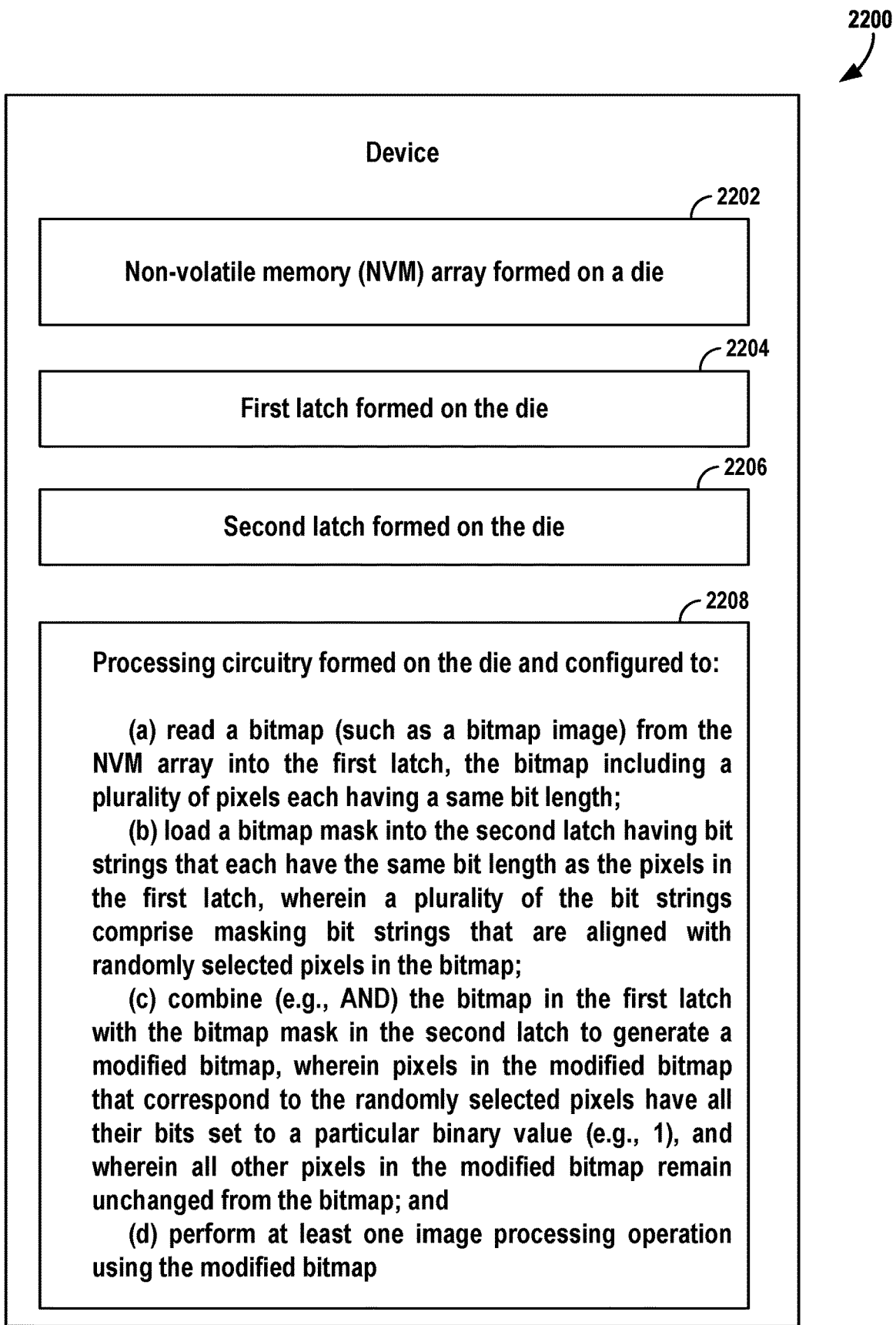
FIG. 22 is block diagram illustrating an exemplary device having an NVM array, according to aspects of the present disclosure, wherein bitmaps are modified to, for example, inject noise to simulate a dead CCD pixel.

FIG. 22 is a block diagram of a device 2200 in accordance with some aspects of the disclosure. The device 2200 (which may be a data storage device) includes an NVM array 2202 formed on a die, a first latch 2204 formed on the die, a second latch 2206 formed on the die, and processing circuit or processing circuitry 2208 formed on the die. The processing circuitry 2208 is configured to: (a) read a bitmap from the NVM array into the first latch, the bitmap including a plurality of pixels each having a same bit length; (b) load a bitmap mask into the second latch having bit strings that each have the same bit length as the pixels in the first latch, wherein a plurality of the bit strings comprise masking bit strings that are aligned with randomly selected pixels in the bitmap; (c) combine (e.g., AND) the bitmap in the first latch with the bitmap mask in the second latch to generate a modified bitmap, wherein pixels in the modified bitmap that correspond to the randomly selected pixels have all their bits set to a particular binary value, and wherein all other pixels in the modified bitmap remain unchanged from the bitmap; and (d) perform at least one image processing operation using the modified bitmap. See, for example, the devices of FIGS. 2 and 13, described above.

Figure 23:
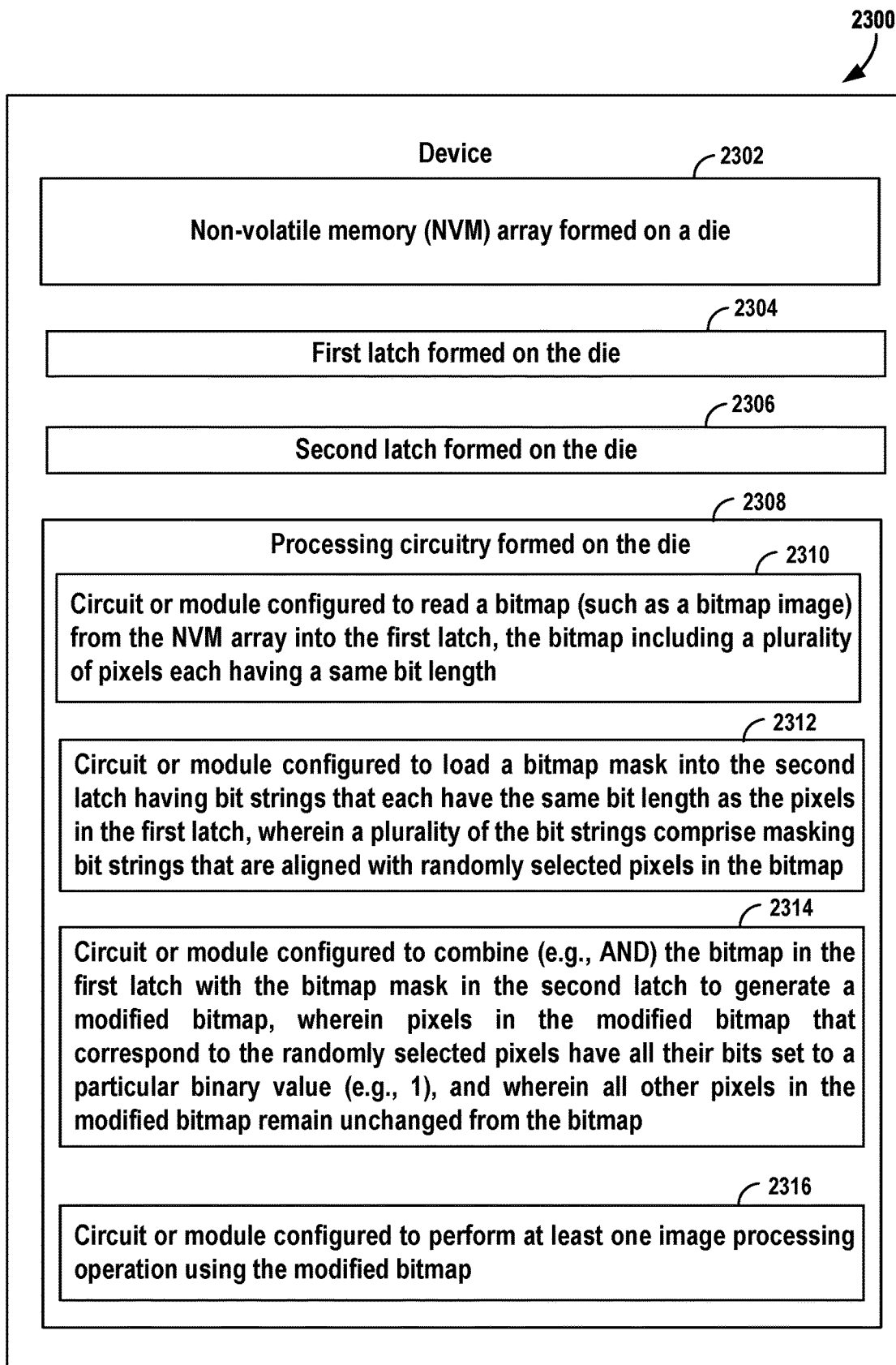
FIG. 23 is block diagram illustrating an exemplary device, according to aspects of the present disclosure, wherein bitmaps are modified to, for example, inject noise to simulate a dead CCD pixel, and particularly illustrating different circuit components.

FIG. 23 is a block diagram of a device 2300 in accordance with some aspects of the disclosure. The device 2300 (which may be a data storage device) includes an NVM array 2302 formed on a die, a first latch 2304 formed on the die, a second latch 2306 formed on the die, and processing circuit or processing circuitry 2308 formed on the die. The processing circuitry 2308 includes: a circuit or module 2310 configured to read a bitmap from the NVM array into the first latch, the bitmap comprising a plurality of pixels each having a same bit length; a circuit or module 2312 configured to load a bitmap mask into the second latch having bit strings that each have the same bit length as the pixels in the first latch, wherein a plurality of the bit strings comprise masking bit strings that are aligned with randomly selected pixels in the bitmap; a circuit or module 2314 configured to combine (e.g., AND) the bitmap in the first latch with the bitmap mask in the second latch to generate a modified bitmap, wherein pixels in the modified bitmap that correspond to the randomly selected pixels have all their bits set to a particular binary value, and wherein all other pixels in the modified bitmap remain unchanged from the bitmap; and a circuit or module 2316 configured to perform at least one image processing operation using the modified bitmap. See, for example, the devices of FIGS. 2 and 13, described above.

In at least some examples, means may be provided for performing the functions illustrated in FIG. 23 and/or other functions illustrated or described herein. For example, the means may include one or more of: means, such as circuit/module 2310, for reading a bitmap from the NVM array into the first latch, the bitmap comprising a plurality of pixels each having a same bit length; means, such as circuit/module 2312, for loading a bitmap mask into the second latch having bit strings that each have the same bit length as the pixels in the first latch, wherein a plurality of the bit strings comprise masking bit strings that are aligned with randomly selected pixels in the bitmap; means, such as circuit/module 2314, for combining (e.g., ANDing) the bitmap in the first latch with the bitmap mask in the second latch to generate a modified bitmap, wherein pixels in the modified bitmap that correspond to the randomly selected pixels have all their bits set to a particular binary value, and wherein all other pixels in the modified bitmap remain unchanged from the bitmap; and means, such as circuit/module 2316, for performing at least one image processing operation using the modified bitmap.

Figure 24:
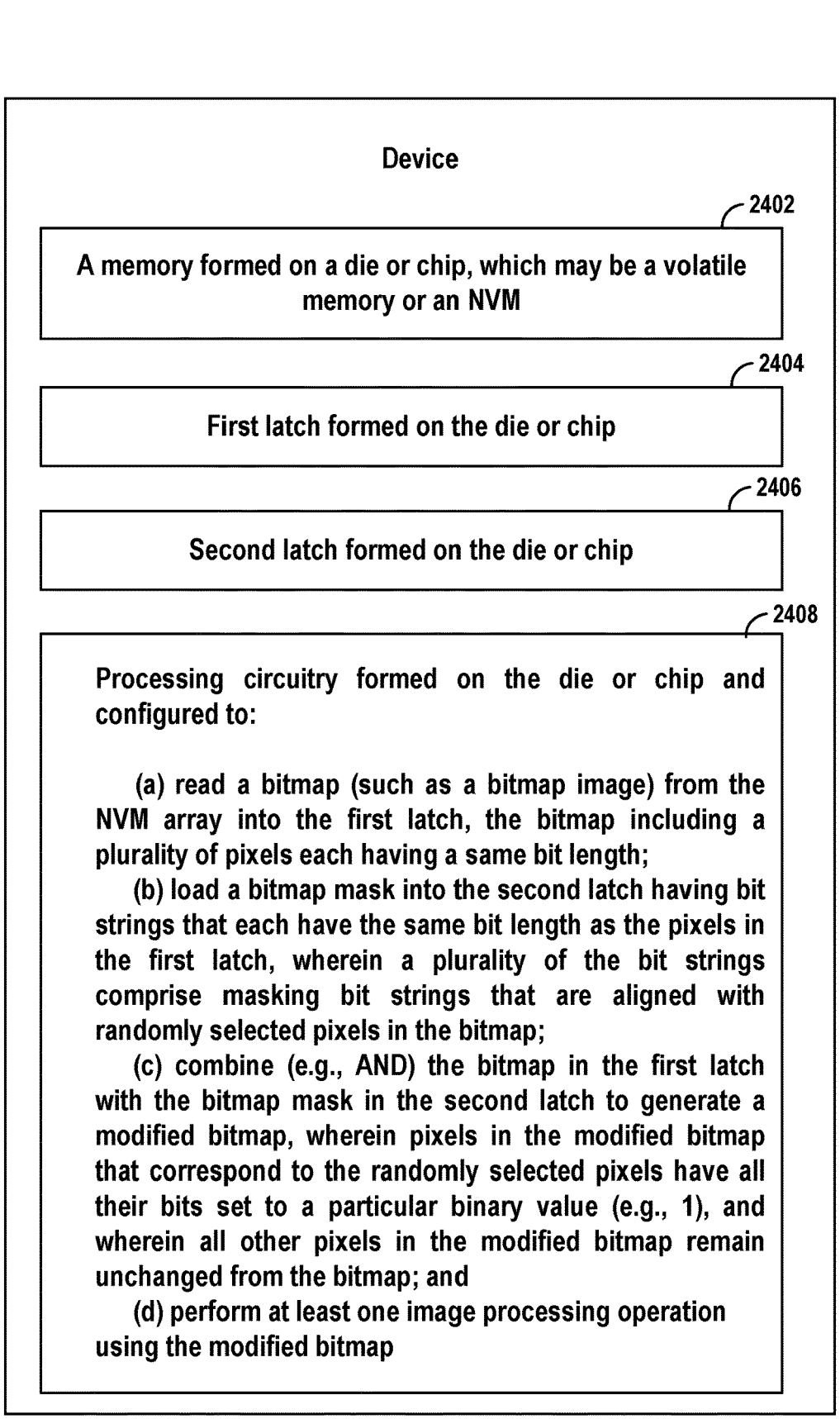
FIG. 24 is block diagram illustrating an exemplary device, according to aspects of the present disclosure having a memory, wherein bitmaps are modified to, for example, inject noise to simulate a dead CCD pixel, and wherein the memory may be volatile or non-volatile.

FIG. 24 is a block diagram of a device 2400 that includes a memory 2402 formed on a die or chip. The device 2400 (which may be a data storage device) also includes a first latch 2404 formed on the die or chip, a second latch 2406 formed on the die or chip, and processing circuit or processing circuitry 2408 formed on the die or chip. The processing circuitry 2408 is configured to: (a) read a bitmap from the NVM array into the first latch, the bitmap including a plurality of pixels each having a same bit length; (b) load a bitmap mask into the second latch having bit strings that each have the same bit length as the pixels in the first latch, wherein a plurality of the bit strings comprise masking bit strings that are aligned with randomly selected pixels in the bitmap; (c) combine (e.g., AND) the bitmap in the first latch with the bitmap mask in the second latch to generate a modified bitmap, wherein pixels in the modified bitmap that correspond to the randomly selected pixels have all their bits set to a particular binary value (e.g., 1), and wherein all other pixels in the modified bitmap remain unchanged from the bitmap; and (d) perform at least one image processing operation using the modified bitmap. The memory may be volatile or non-volatile.

Figure 25:
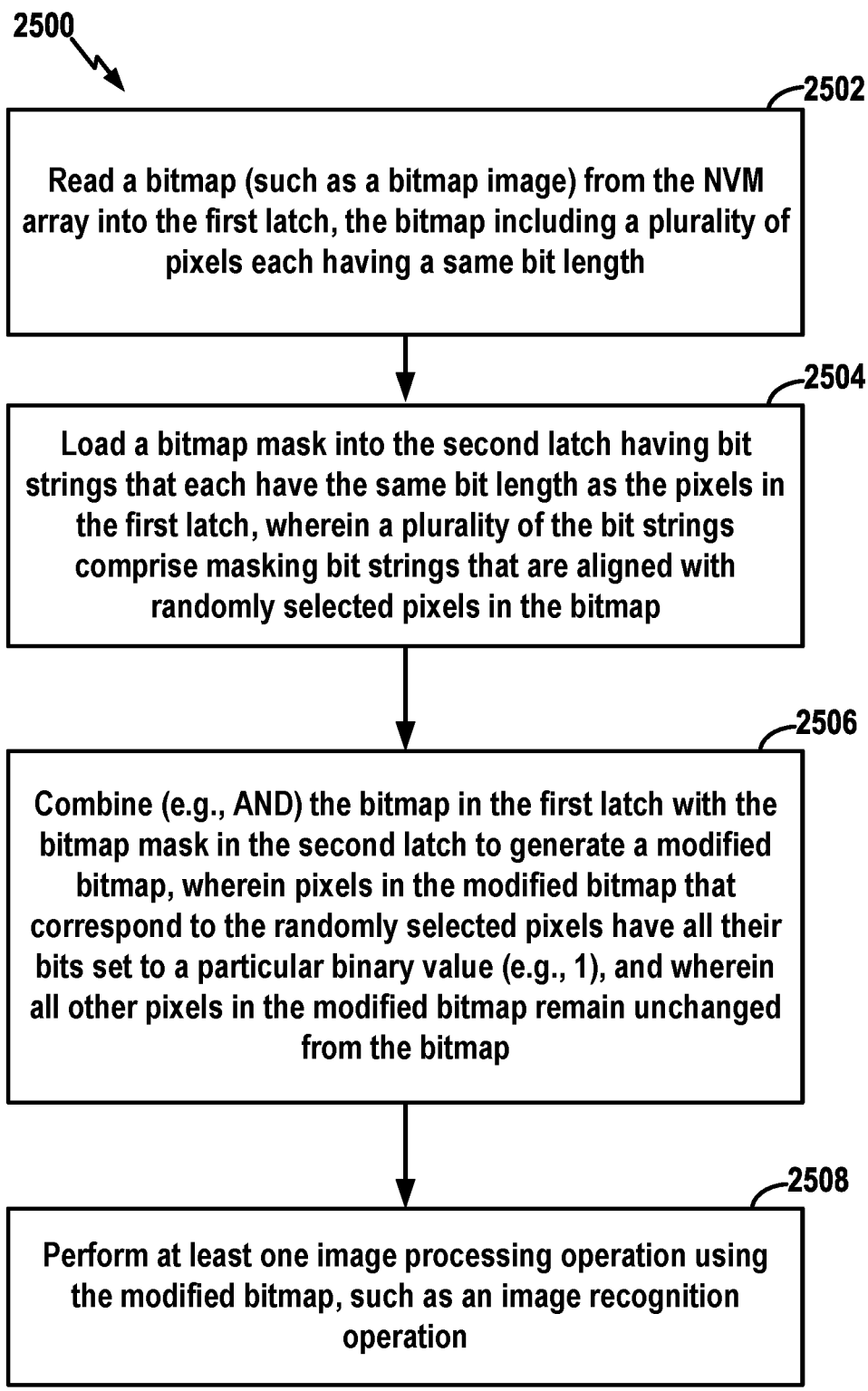
FIG. 25 is a flow chart of an exemplary method, according to aspects of the present disclosure, wherein bitmaps are modified to, for example, inject noise to simulate a dead CCD pixel.

FIG. 25 illustrates a method or process 2500 in accordance with some aspects of the disclosure. The process 2500 may take place within any suitable device (which may be a data storage device) or apparatus capable of performing the operations, such as a NAND die configured with appropriate processing circuitry. See, for example, the devices of FIGS. 2, 13, 22 and 23, described above. At block 2502, the device reads a bitmap (such as bitmap image) from the NVM array into the first latch, the bitmap including a plurality of pixels each having a same bit length. At block 2504, the device loads a bitmap mask into the second latch having bit strings that each have the same bit length as the pixels in the first latch, wherein a plurality of the bit strings comprises or consists of masking bit strings that are aligned with randomly selected pixels in the bitmap. At block 2506, the device combines (e.g., ANDs) the bitmap in the first latch with the bitmap mask in the second latch to generate a modified bitmap, wherein pixels in the modified bitmap that correspond to the randomly selected pixels have all their bits set to a particular binary value (e.g., 1), and wherein all other pixels in the modified bitmap remain unchanged from the bitmap. At block 2508, the device performs at least one image processing operation using the modified bitmap, such as an image recognition operation. See, for example, the method of FIGS. 7 and 8, described above.

Figure 26:
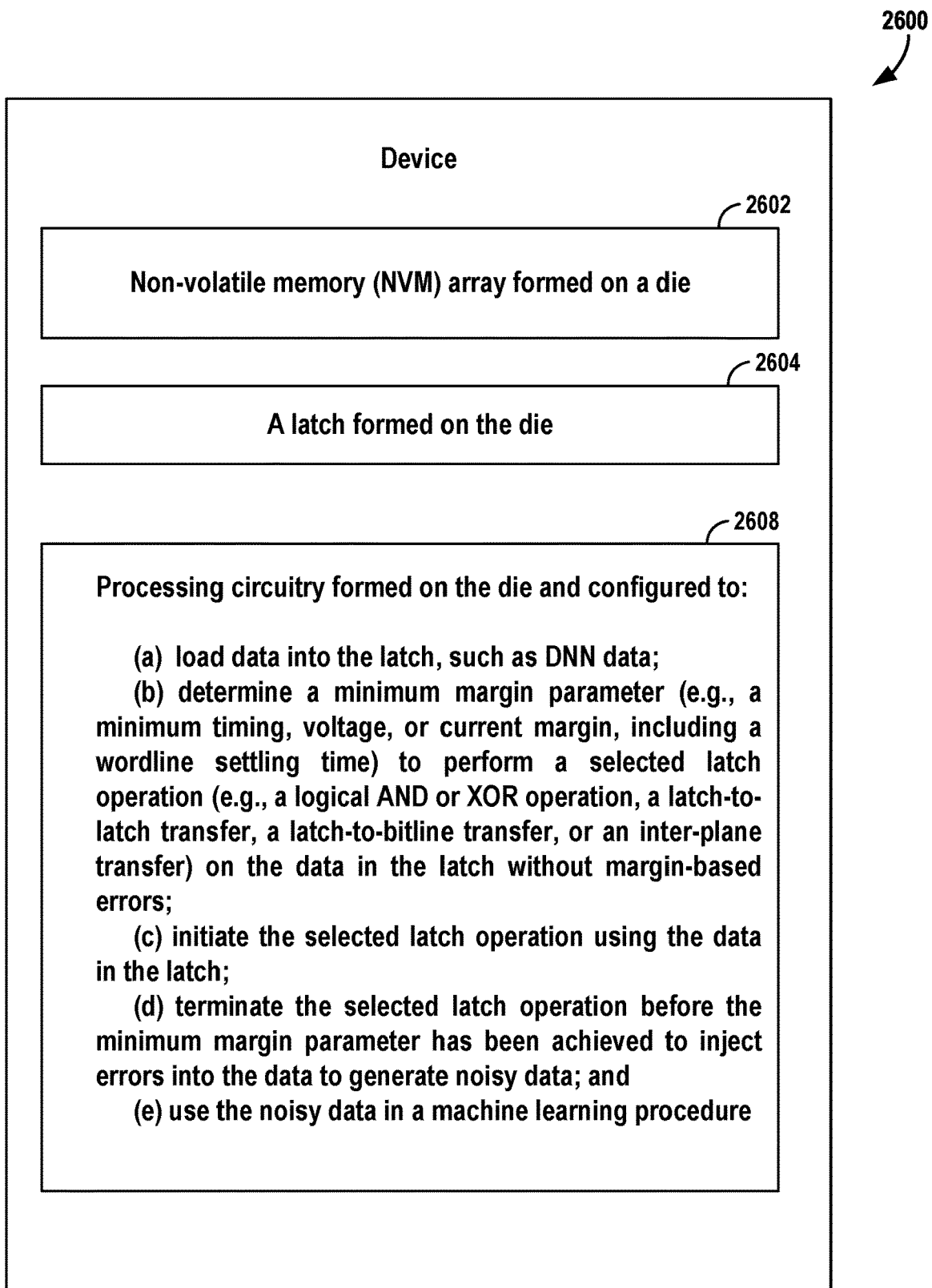
FIG. 26 is block diagram illustrating an exemplary device having an NVM array, according to aspects of the present disclosure, wherein noise is injected by performing latch operations without, e.g., allowing sufficient time for operations to be faithfully completed or without, e.g., providing sufficient voltage to transistors.

FIG. 26 is a block diagram of a device 2600 in accordance with some aspects of the disclosure. The device 2600 (which may be a data storage device) includes an NVM array 2602 formed on a die, a latch 2604 formed on the die, and processing circuit or processing circuitry 2608 formed on the die. The processing circuitry 2608 is configured to: (a) load data into the latch, such as DNN data; (b) determine a minimum margin parameter (e.g., a minimum timing, voltage, or current margin, including a wordline settling time) to perform a selected latch operation (e.g., a logical AND or XOR operation, a latch-to-latch transfer, a latch-to-bitline transfer, or an inter-plane transfer) on the data in the latch without margin-based errors; (c) initiate the selected latch operation using the data in the latch; (d) terminate the selected latch operation before the minimum margin parameter has been achieved to inject errors into the data to generate noisy data (such as by terminating the operation before sufficient time has elapsed to faithfully complete a data transfer or before a sufficient voltage is applied to transistors; and (e) use the noisy data in a machine learning procedure. See, for example, the devices of FIGS. 2 and 13, described above.

Figure 27:
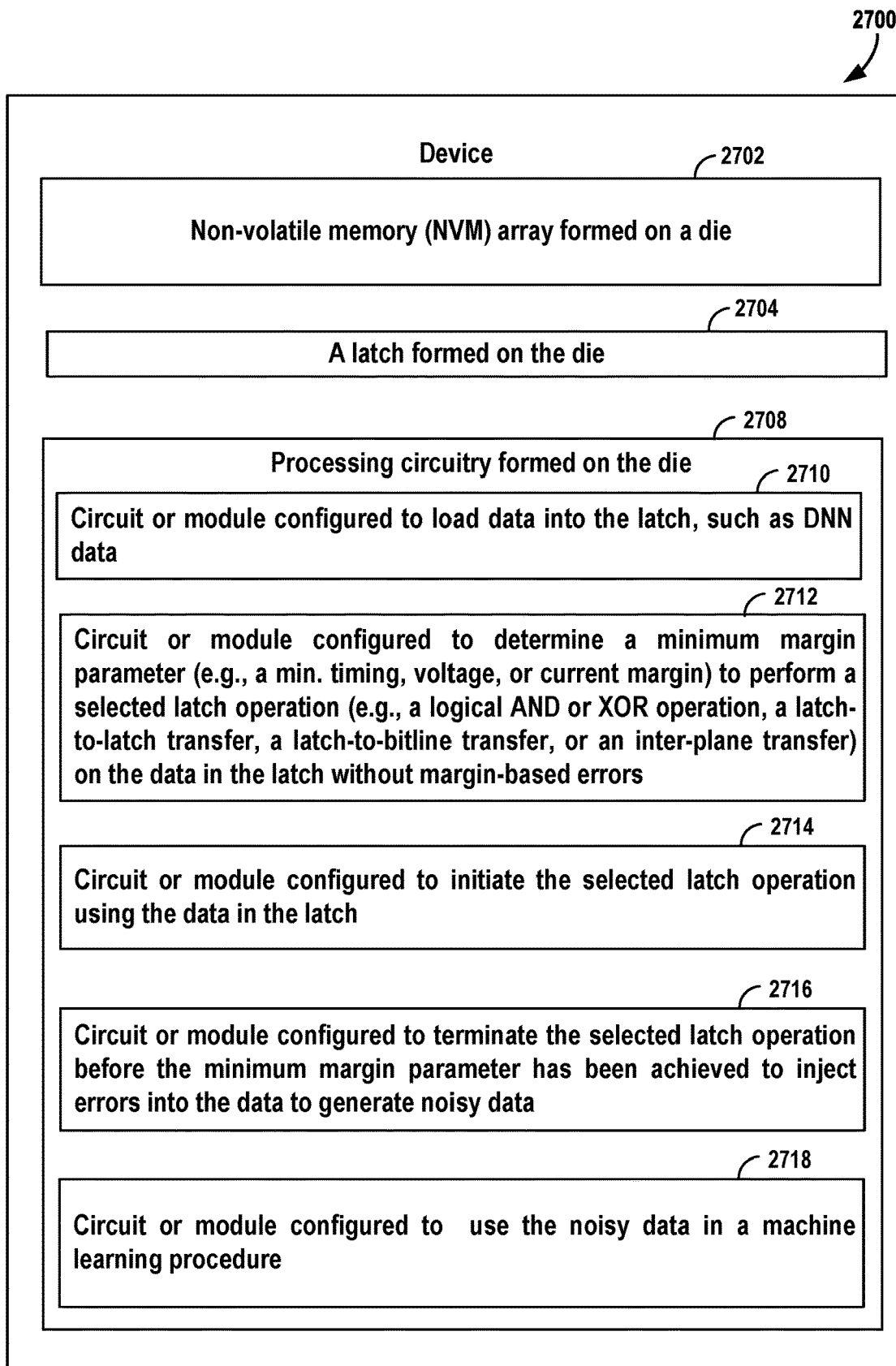
FIG. 27 is block diagram illustrating an exemplary device, according to aspects of the present disclosure, wherein noise is injected by performing latch operations without, e.g., allowing sufficient time for operations to be faithfully completed, and particularly illustrating different circuit components.

FIG. 27 is a block diagram of a device 2700 in accordance with some aspects of the disclosure. The device 2700 (which may be a data storage device) includes an NVM array 2702 formed on a die, a latch 2704 formed on the die, and processing circuit or processing circuitry 2708 formed on the die. The processing circuitry 2708 includes: a circuit or module 2710 configured to load data into the latch, such as DNN data; a circuit or module 2712 configured to determine a minimum margin parameter (e.g., a minimum timing, voltage, or current margin) to perform a selected latch operation (e.g., a logical AND or XOR operation, a latch-to-latch transfer, a latch-to-bitline transfer, or an inter-plane transfer) on the data in the latch without margin-based errors; a circuit or module 2714 configured to initiate the selected latch operation using the data in the latch; a circuit or module 2716 configured to terminate the selected latch operation before the minimum margin parameter has been achieved to inject errors into the data to generate noisy data; a circuit or module 2718 configured to use the noisy data in a machine learning procedure. See, for example, the devices of FIGS. 2 and 13, described above.

In at least some examples, means may be provided for performing the functions illustrated in FIG. 27 and/or other functions illustrated or described herein. For example, the means may include one or more of: means, such as circuit/module 2710, for loading data into the latch, such as DNN data; means, such as circuit/module 2712, for determining a minimum margin parameter (e.g., a minimum timing, voltage, or current margin) to perform a selected latch operation (e.g., a logical AND or XOR operation, a latch-to-latch transfer, a latch-to-bitline transfer, or an inter-plane transfer) on the data in the latch without margin-based errors; means, such as circuit/module 2714, for initiating the selected latch operation using the data in the latch; means, such as circuit/module 2716, for terminating the selected latch operation before the minimum margin parameter has been achieved to inject errors into the data to generate noisy data; and means, such as circuit/module 2716, for using the noisy data in a machine learning procedure.

Figure 28:
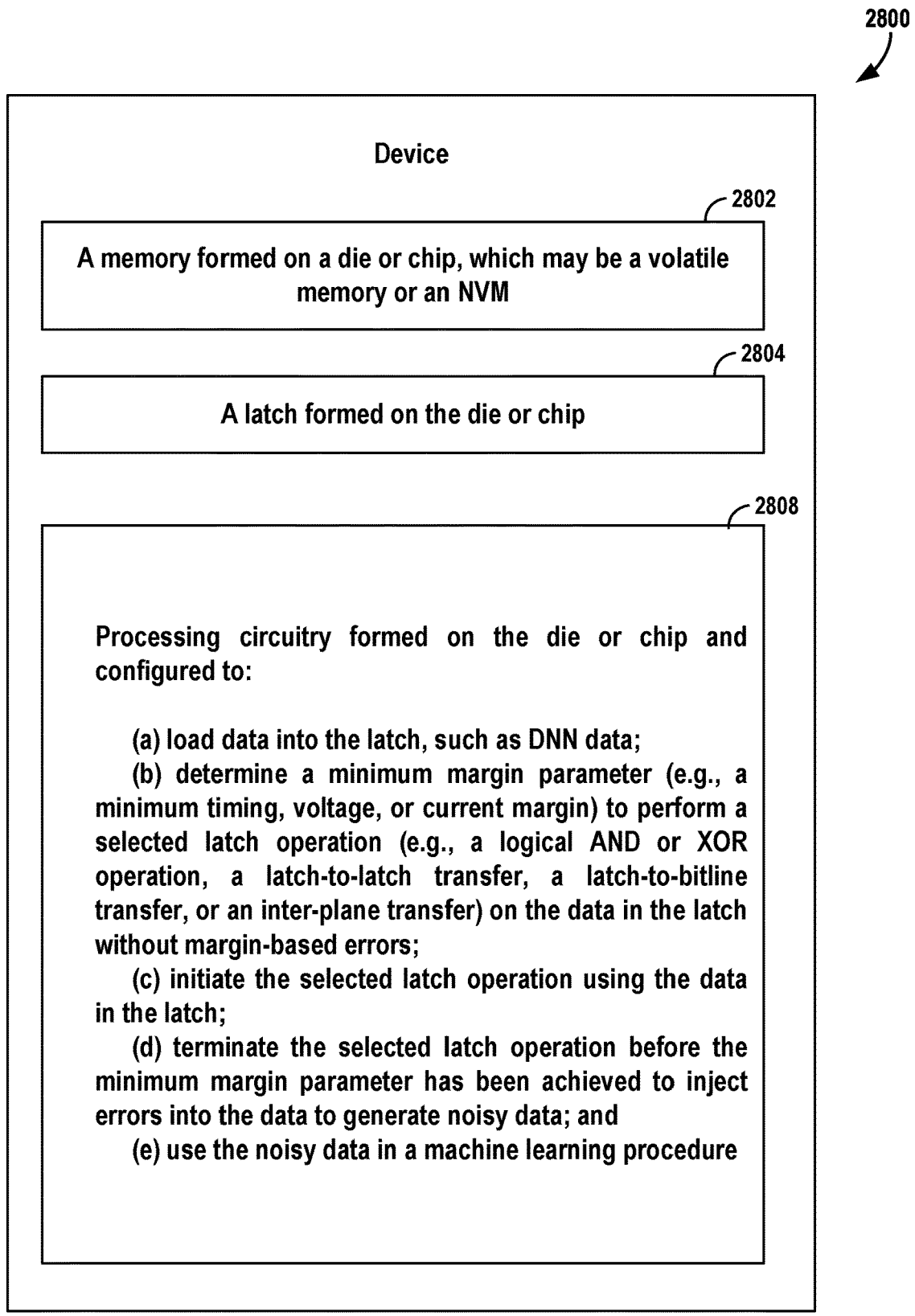
FIG. 28 is block diagram illustrating an exemplary device, according to aspects of the present disclosure having a memory, wherein noise is injected by performing latch operations without, e.g., allowing sufficient time for operations to be faithfully completed, and wherein the memory may be volatile or non-volatile.

FIG. 28 is a block diagram of a device 2800 that includes a memory 2802 formed on a die or chip. The device 2800 (which may be a data storage device) also includes a latch 2804 formed on the die or chip, and processing circuit or processing circuitry 2808 formed on the die or chip. The processing circuitry 2808 is configured to: (a) load data into the latch, such as DNN data; (b) determine a minimum margin parameter (e.g., a minimum timing, voltage, or current margin) to perform a selected latch operation (e.g., a logical AND or XOR operation, a latch-to-latch transfer, a latch-to-bitline transfer, or an inter-plane transfer) on the data in the latch without margin-based errors; (c) initiate the selected latch operation using the data in the latch; (d) terminate the selected latch operation before the minimum margin parameter has been achieved to inject errors into the data to generate noisy data; and (e) use the noisy data in a machine learning procedure.

Figure 29:
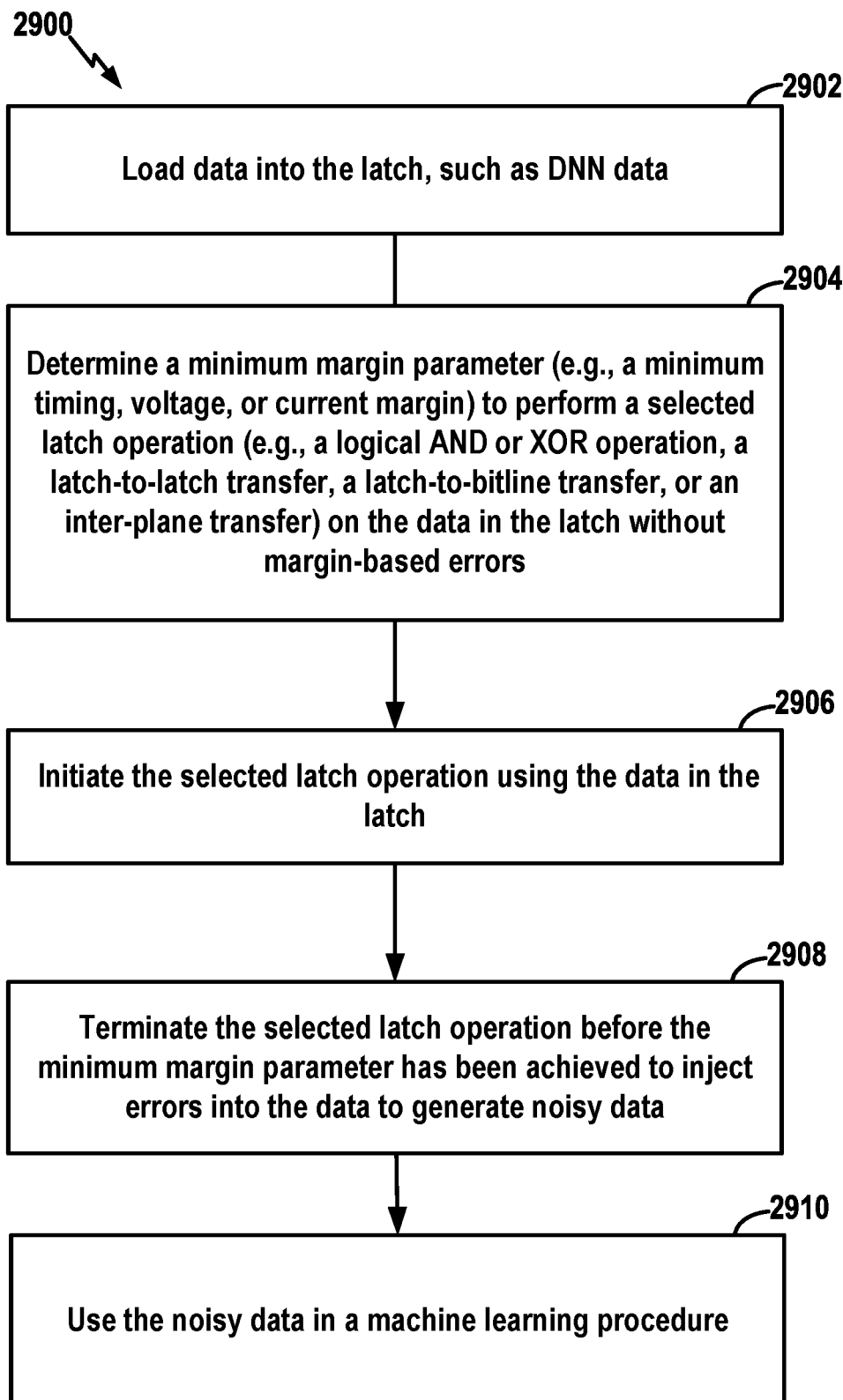
FIG. 29 is a flow chart of an exemplary method, according to aspects of the present disclosure, wherein noise is injected by performing latch operations without, e.g., allowing sufficient time for operations to be faithfully completed.

FIG. 29 illustrates a method or process 2900 in accordance with some aspects of the disclosure. The process 2900 may take place within any suitable device (which may be a data storage device) or apparatus capable of performing the operations, such as a NAND die configured with appropriate processing circuitry. See, for example, the devices of FIGS. 2, 13, 26 and 27, described above. At block 2902, the device loads data into the latch, such as DNN data. At block 2904, the device determines a minimum margin parameter (e.g., a minimum timing, voltage, or current margin) to perform a selected latch operation (e.g., a logical AND or XOR operation, a latch-to-latch transfer, a latch-to-bitline transfer, or an inter-plane transfer) on the data in the latch without margin-based errors. At block 2906, the device initiates the selected latch operation using the data in the latch. At block 2908, the device terminates the selected latch operation before the minimum margin parameter has been achieved to inject errors into the data to generate noisy data. At block 2910, the device uses the noisy data in a machine learning procedure. See, for example, the methods of FIGS. 9-12.

Additional Aspects

Aspects of the subject matter described herein can be implemented in any suitable NAND flash memory, such as 3D NAND flash memory. Semiconductor memory devices include volatile memory devices, such as DRAM) or SRAM devices, NVM devices, such as ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration. See, also, 3D XPoint (3DXP)) memories. Each type of memory device may have different configurations. For example, flash memory devices may be configured in a NAND or a NOR configuration.

Regarding the application of the features described herein to other memories besides NAND: NOR, 3DXP, PCM, and ReRAM have page-based architectures and programming processes that usually require operations such as shifts, XORs, ANDs, etc. If such devices do not already have latches (or their equivalents), latches can be added to support the latch-based operations described herein. Note also that latches can have a small footprint relative to the size of a memory array as one latch can connect to many thousands of cells, and hence adding latches does not typically require much circuit space.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the z direction) with each column having multiple memory elements in each column. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A device formed on a die, comprising:
a non-volatile memory (NVM) array formed on the die;
a first latch and a second latch, each formed on the die; and
processing circuitry formed on the die configured to:

read data from the NVM array into the first latch;
obtain stochastic data;
load the stochastic data into the second latch;
combine the stochastic data in the second latch with a shifted version of itself to obtain modified stochastic data;
combine the read data in the first latch with the modified stochastic data in the second latch to obtain noisy data; and
perform at least one data processing operation using the noisy data.

2. The device of claim 1, wherein the data is neural network data and the data processing operation is a neural network operation.

3. The device of claim 1, wherein the stochastic data is random or pseudorandom data.

4. The device of claim 1, wherein the processing circuitry is configured to combine the read data in the first latch with the modified stochastic data in the second latch by XORing the read data and the stochastic data.

5. The device of claim 1, wherein the processing circuitry is further configured to:
scramble the data before the data is stored in the NVM array so that the data read from the first latch is scrambled data; and
unscramble the noisy data before performing the at least one data processing operation.

6. The device of claim 1, wherein the NVM array comprises at least one of: a NAND array, a NOR array, phase-change memory (PCM) array, magneto-resistive random access memory (MRAM) arrays, a resistive random access memory (ReRAM) array, or a 3D XPoint (3DXP) array.

7. A device formed on a die, comprising:
a non-volatile memory (NVM) array formed on the die;
a first latch and a second latch, each formed on the die; and
processing circuitry formed on the die configured to:
read a bitmap from the NVM array into the first latch, the bitmap comprising a plurality of pixels each having a same bit length;
load a bitmap mask into the second latch having bit strings that each have the same bit length as the pixels in the first latch, wherein a plurality of the bit strings comprise masking bit strings that are aligned with randomly selected pixels in the bitmap;
combine the bitmap in the first latch with the bitmap mask in the second latch using an AND operation or an exclusive-OR (XOR) operation to generate a modified bitmap so that the bits of the pixels in the modified bitmap that correspond to the randomly selected pixels are all set to a particular binary value, whereas the bits in all other pixels in the modified bitmap remain unchanged from the bitmap; and
perform at least one image processing operation using the modified bitmap.

8. The device of claim 7, wherein the processing circuitry is configured to generate the bitmap mask by being further configured to:
determine the bit length of the pixels in the bitmap;
generate a pixel mask that is set to all 1s and has the same bit length; and
randomly distribute one or more instances of the pixel mask within an initial bitmap where all pixels are initially set to all 0s.

9. The device of claim 7, wherein the processing circuitry is configured to generate the bitmap mask by being further configured to:
determine the bit length of the pixels in the bitmap;
generate a pixel mask that is set to all 0s and has the same bit length; and
randomly distribute one or more instances of the pixel mask within an initial bitmap where all pixels are initially set to all 1s.

10. A device formed on a die, comprising:
a non-volatile memory (NVM) array formed on the die;
a latch formed on the die; and
processing circuitry formed on the die configured to:
load data into the latch;
determine a minimum margin parameter to perform a selected latch operation on the data in the latch without margin-based errors;
initiate the selected latch operation using the data in the latch;
terminate the selected latch operation before the minimum margin parameter has been achieved to inject errors into the data to generate noisy data; and
use the noisy data in a machine learning procedure.

11. The device of claim 10, wherein the minimum margin parameter is a threshold amount of time to complete the latch operation without errors and wherein the processing circuitry is configured to terminate the selected latch operation before the threshold amount of time has elapsed.

12. The device of claim 10, wherein the minimum margin parameter is a threshold voltage to be applied to transistors within circuitry configured to perform the selected latch operation and wherein the processing circuitry is configured to terminate the selected latch operation before the threshold voltage has been applied.

13. The device of claim 10, wherein the minimum margin parameter is a threshold current to be applied to transistors within circuitry configured to perform the selected latch operation and wherein the processing circuitry is configured to terminate the selected latch operation before the threshold current has been applied.

14. The device of claim 10, wherein the selected latch operation is at least one of: an AND operation, a XOR operation, a XNOR operation, or a latch-to-latch transfer.

15. The device of claim 10, wherein the selected latch operation comprises at least one of a bitline sensing or bitline programming operation and wherein the minimum margin parameter comprises one or more of a bitline sensing time, a bitline sensing voltage, a bitline sensing current, a bitline charging time, a bitline charging voltage, or a bitline charging current.

16. The device of claim 10, wherein the die is a multi-planar die and wherein the latch is on a first plane of the die and the selected latch operation comprises a transfer from the latch on the first plane of the die to a latch or bitline on a second plane of the die.

17. The device of claim 1, wherein the processing circuitry is further configured to combine the stochastic data with the shifted version of itself using one or more of an AND operation or an OR operation.

18. The device of claim 1, wherein the processing circuitry is further configured to combine the stochastic data with the shifted version of itself to achieve a programmed percentage of 1s in the modified stochastic data.

19. A method for use by a device formed on a die that includes a non-volatile memory (NVM) array and a first latch and a second latch, the method comprising:
reading data from the NVM array into the first latch;
obtaining stochastic data;
loading the stochastic data into the second latch;

combining the stochastic data in the second latch with a shifted version of itself to obtain modified stochastic data;

combining the read data in the first latch with the modified stochastic data in the second latch to obtain noisy data; and performing at least one data processing operation using the noisy data.

20. The method of claim 19, wherein the data is neural network data and the data processing operation is a neural network operation.

21. The method of claim 19, wherein the stochastic data is random or pseudorandom data.

22. The method of claim 19, wherein combining the read data in the first latch with the modified stochastic data in the second latch comprises XORing the read data and the modified stochastic data.

23. The method of claim 19, further comprising:
scrambling the data before the data is stored in the NVM array so that the data read from the first latch is scrambled data; and
unscrambling the noisy data before performing the at least one data processing operation.

24. An apparatus for use by a device formed on a die that includes a non-volatile memory (NVM) array and a first latch and a second latch, the apparatus comprising:
means for reading data from the NVM array into the first latch;
means for obtaining stochastic data;
means for loading the stochastic data into the second latch;
means for combining the stochastic data in the second latch with a shifted version of itself to obtain modified stochastic data;
means for combining the read data in the first latch with the modified stochastic data in the second latch to obtain noisy data; and
means for performing at least one data processing operation using the noisy data.

25. A method for use by a device formed on a die that includes a non-volatile memory (NVM) array and first and second latches, the method comprising:
reading a bitmap from the NVM array into the first latch, the bitmap comprising a plurality of pixels each having a same bit length;
loading a bitmap mask into the second latch having bit strings that each have the same bit length as the pixels in the first latch, wherein a plurality of the bit strings comprise masking bit strings that are aligned with randomly selected pixels in the bitmap;
combining the bitmap in the first latch with the bitmap mask in the second latch using an AND operation or an exclusive-OR (XOR) operation to generate a modified bitmap so that the bits of the pixels in the modified bitmap that correspond to the randomly selected pixels are all set to a particular binary value, whereas the bits in all other pixels in the modified bitmap remain unchanged from the bitmap; and
performing at least one image processing operation using the modified bitmap.

26. A method for use by a device formed on a die that includes a non-volatile memory (NVM) array and a latch, the method comprising:
loading data into the latch;
determining a minimum margin parameter to perform a selected latch operation on the data in the latch without margin-based errors;
initiating the selected latch operation using the data in the latch;
terminating the selected latch operation before the minimum margin parameter has been achieved to inject errors into the data to generate noisy data; and
using the noisy data in a machine learning procedure.

27. The method of claim 26, wherein the minimum margin parameter is a threshold amount of time to complete the latch operation without errors and wherein the selected latch operation is terminated before the threshold amount of time has elapsed.

28. The method of claim 26, wherein the minimum margin parameter is a threshold voltage to be applied to transistors within circuitry configured to perform the selected latch operation and wherein the selected latch operation is terminated before the threshold voltage has been applied.

29. The method of claim 26, wherein the minimum margin parameter is a threshold current to be applied to transistors within circuitry configured to perform the selected latch operation and wherein the selected latch operation is terminated before the threshold current has been applied.

30. The method of claim 26, wherein the selected latch operation is one or more of an AND operation, a XOR operation, a XNOR operation, or a latch-to-latch transfer.

31. The method of claim 26, wherein the selected latch operation comprises one or more of a bitline sensing or bitline programming operation and wherein the margin parameter comprises one or more of a bitline sensing time, a bitline sensing voltage, a bitline sensing current, a bitline charging time, a bitline charging voltage, and a bitline charging current.

32. The method of claim 26, wherein the die is a multi-planar die and wherein the latch is on a first plane of the die and the selected latch operation comprises transferring data from the latch on the first plane of the die to a latch or bitline on a second plane of the die.

* * * * *